United States Patent
Manfrini

(10) Patent No.: US 12,349,603 B2
(45) Date of Patent: Jul. 1, 2025

(54) TRANSISTOR, SEMICONDUCTOR DEVICE INCLUDING THE SAME, AND MANUFACTURING METHOD THEREOF

(71) Applicant: Taiwan Semiconductor Manufacturing Company, Ltd., Hsinchu (TW)

(72) Inventor: Mauricio Manfrini, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/766,644

(22) Filed: Jul. 8, 2024

(65) Prior Publication Data

US 2024/0365681 A1 Oct. 31, 2024

Related U.S. Application Data

(60) Continuation of application No. 17/847,192, filed on Jun. 23, 2022, now Pat. No. 12,063,870, which is a division of application No. 16/924,214, filed on Jul. 9, 2020, now Pat. No. 11,398,597.

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/22* (2023.02); *H10N 50/01* (2023.02)

(58) Field of Classification Search
CPC ..... H10N 50/80; H10D 88/00; H10D 30/6755
See application file for complete search history.

(56) References Cited

U.S. PATENT DOCUMENTS

2012/0199822 A1* 8/2012 Kamura ................. H10K 10/84
257/40
2019/0273119 A1* 9/2019 Zhou ....................... H10B 63/30

* cited by examiner

*Primary Examiner* — Shih Tsun A Chou
(74) *Attorney, Agent, or Firm* — JCIPRNET

(57) ABSTRACT

A back-end-of-line transistor includes a channel strip, a source contact, a drain contact, a high-k dielectric strip, a gate pattern, and self-assembled monolayers. The channel strip includes a semiconductor oxide material. The source contact contacts a first end of the channel strip. The drain contact contacts a second end of the channel strip. The high-k dielectric strip extends on the channel strip in between the first end and the second end of the channel strip. The gate pattern extends on the high-k dielectric strip. The self-assembled monolayers are disposed in between the channel strip and the source and drain contacts. The self-assembled monolayers include a compound having a polar group. The polar group is bonded to at least one selected from the channel strip, the source contact, and the drain contact.

20 Claims, 21 Drawing Sheets

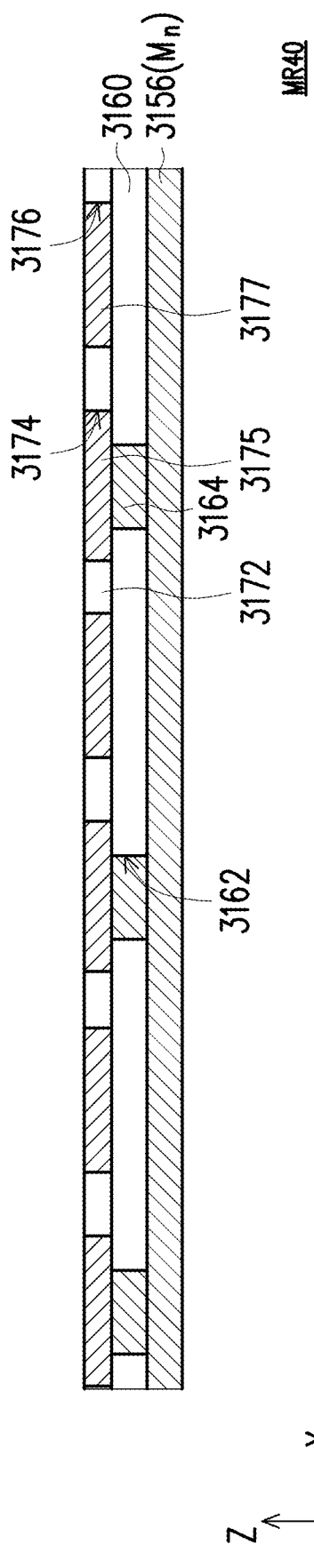
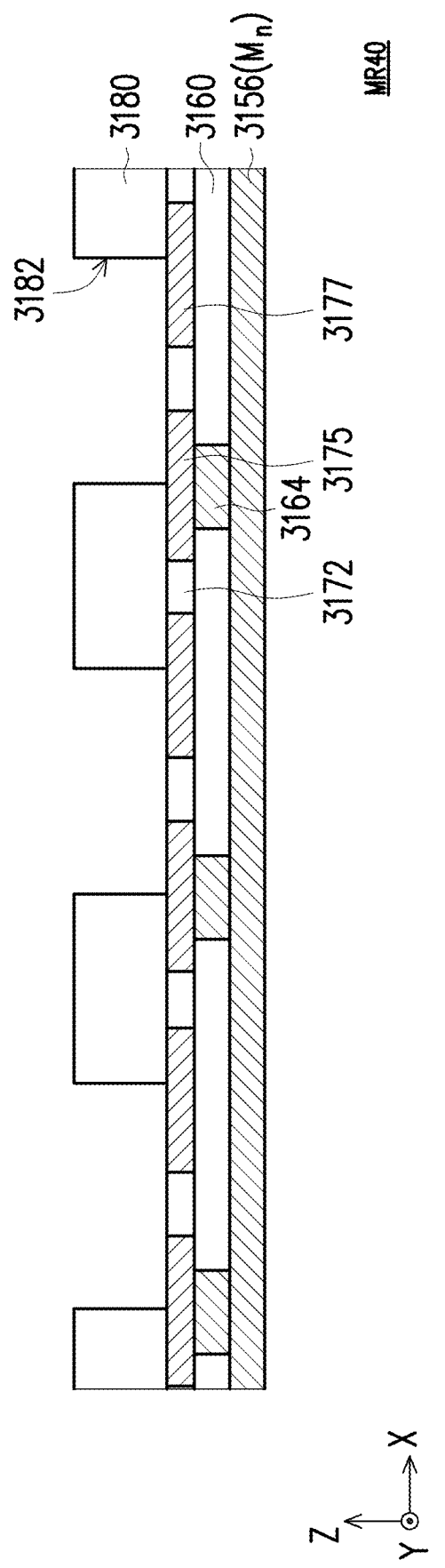
FIG. 4A
FIG. 4B

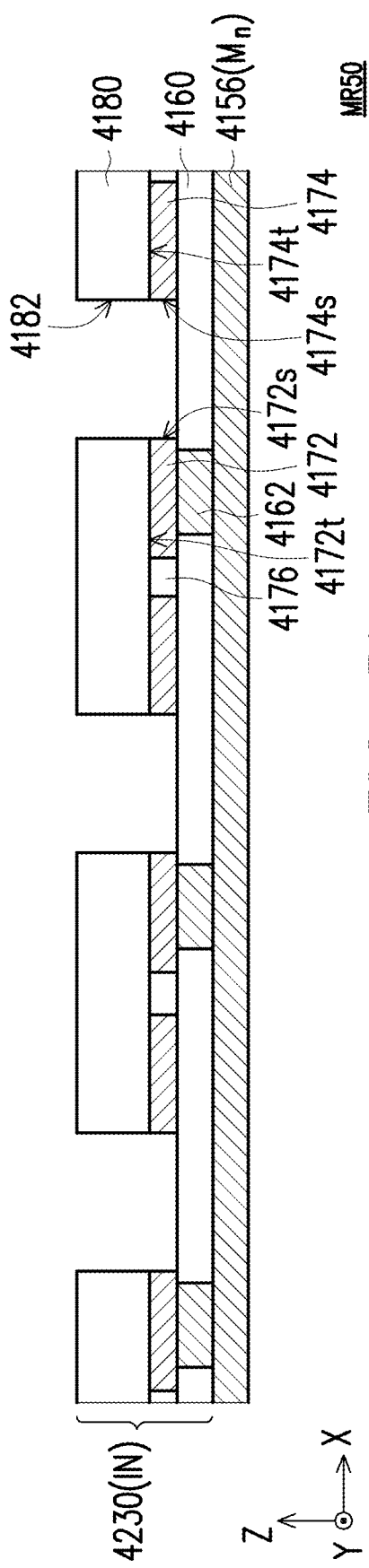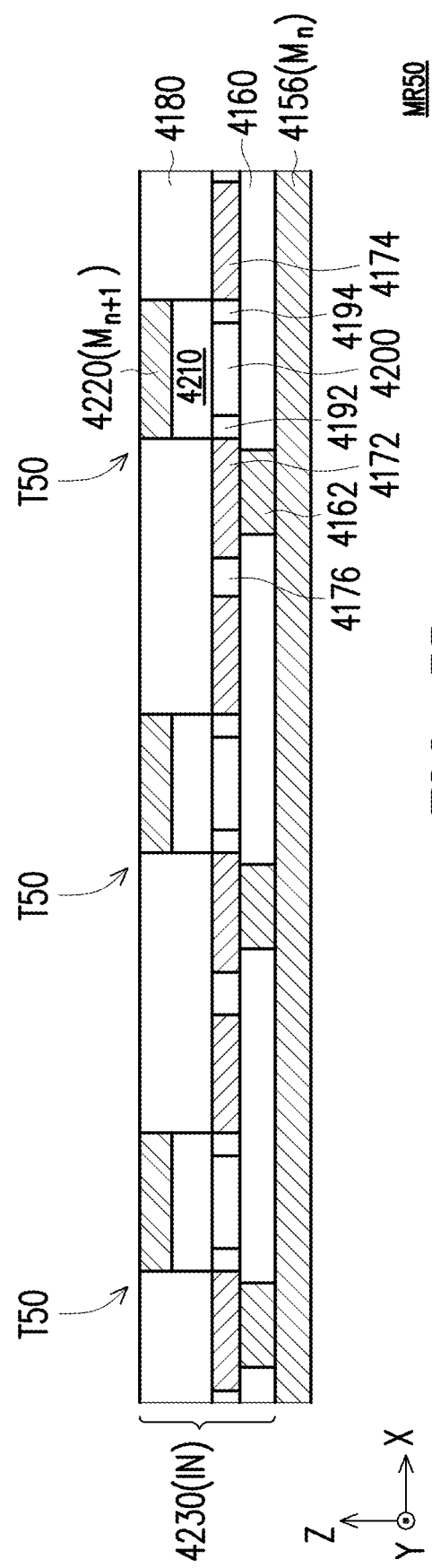

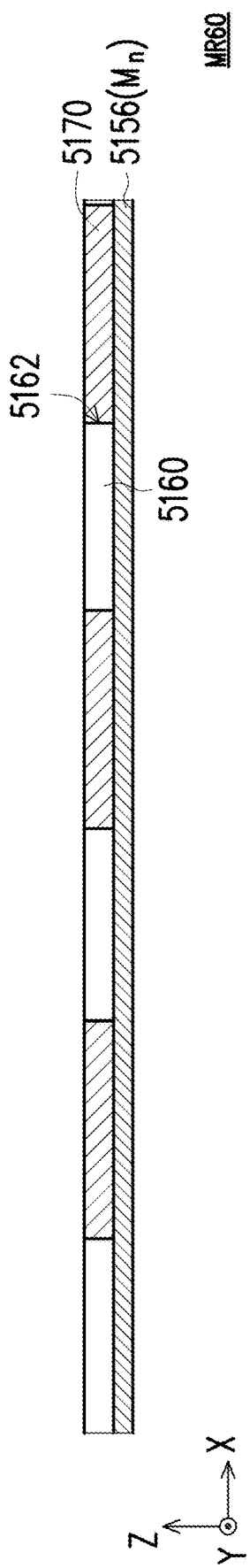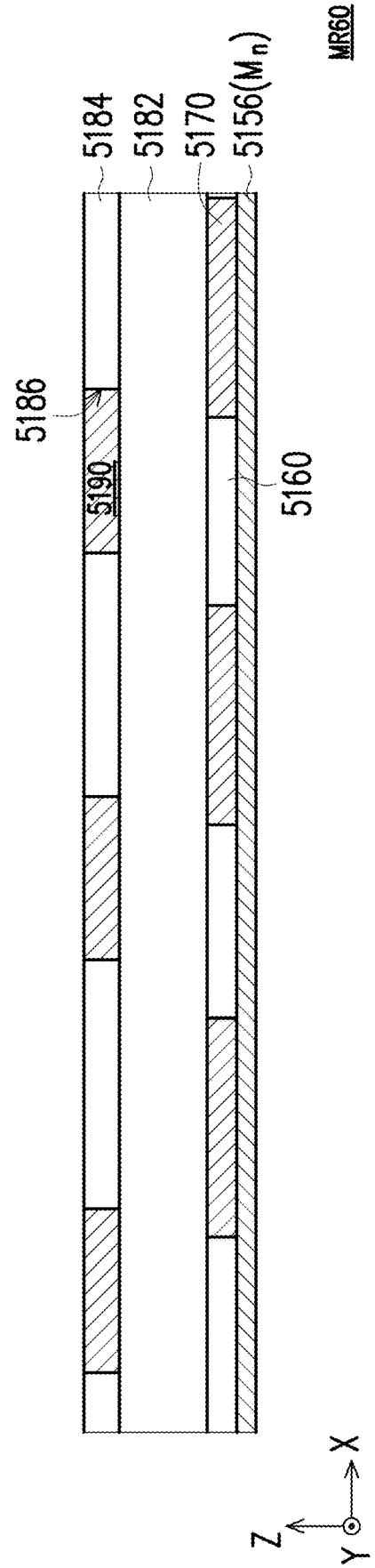
FIG. 6A
FIG. 6B

TRANSISTOR, SEMICONDUCTOR DEVICE INCLUDING THE SAME, AND MANUFACTURING METHOD THEREOF

CROSS-REFERENCE TO RELATED APPLICATION

This application is a continuation application of and claims the priority benefit of a prior application Ser. No. 17/847,192, filed on Jun. 23, 2022. The prior application Ser. No. 17/847,192 is a divisional application of and claims the priority benefit of a prior application Ser. No. 16/924,214, filed on Jul. 9, 2020. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4D are schematic cross-sectional views of structures formed during a manufacturing process of a semiconductor device in accordance with some embodiments of the disclosure.

FIG. 5A to FIG. 5C are schematic cross-sectional views of structures formed during a manufacturing process of a semiconductor device in accordance with some embodiments of the disclosure.

FIG. 6A to FIG. 6E are schematic cross-sectional views of structures formed during a manufacturing process of a semiconductor device in accordance with some embodiments of the disclosure.

DETAILED DESCRIPTION

Figure 1A:
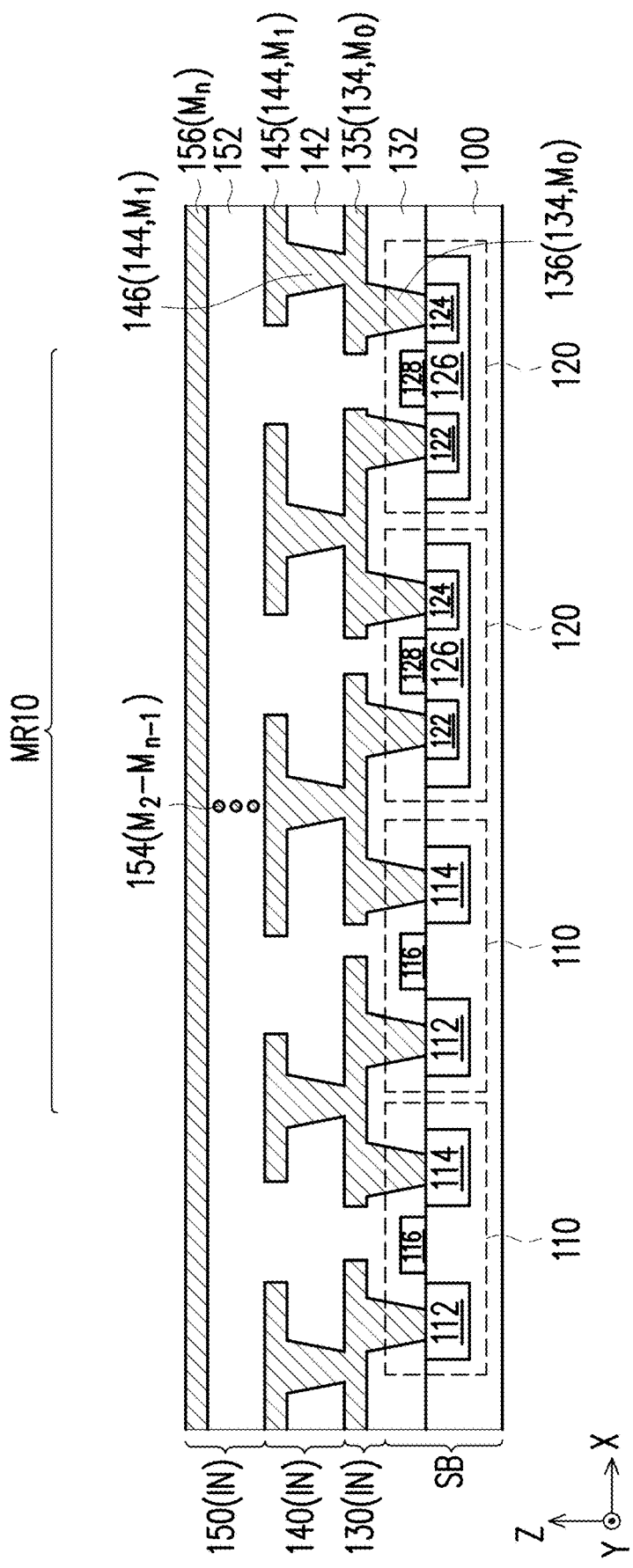
FIG. 1A to FIG. 1M are schematic cross-sectional views of structures formed during a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1M are schematic cross-sectional views illustrating a manufacturing process of a semiconductor device D10 in accordance with some embodiments of the disclosure.

Referring to FIG. 1A, a semiconductor substrate 100 is provided. In some embodiments, the semiconductor substrate 100 includes one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 100 may be a semiconductor-on-insulator, including at least one layer of dielectric material (e.g., an oxide layer) disposed between a pair of semiconductor layers. In some embodiments, devices of an integrated circuit are formed in and on the semiconductor substrate 100. For example, in FIG. 1A are illustrated two planar transistors 110 and two planar transistors 120 formed in the semiconductor substrate 100. Each planar transistor 110 includes at least one pair of source and drain regions 112, 114 separated by a portion of semiconductor substrate 100 which functions as a channel region of the transistor 110. In some embodiments, the channel region may include semiconductor oxide materials. A gate structure 116 is disposed on the channel region in between the source and drain regions 112, 114. In some embodiments, the source and drain regions 112, 114 may be doped, for example with n-type materials or p-type materials. In some embodiments, each planar transistor 120 also includes a pair of source and drain regions 122, 124, which may be optionally doped with n-type materials or p-type materials. In some embodiments, the source and drain regions 122, 124 are doped with materials of opposite conductivity type with respect to the source and drain regions 112, 114. In some embodiments, the source and drain regions 122, 124 may be embedded in a region 126 doped with a material of opposite conductivity type. For example, the source and drain regions 122, 124 may be doped with a p-type material, and the region 126 may be doped with an n-type material. In some embodiments, a gate structure 128 is disposed on the region 126 in between the source and drain regions 122, 124. In some embodiments, the semiconductor substrate 100 with the devices (e.g., the transistors 110, 120) formed therein may be referred to as a substrate region SB, or, sometimes, front-end-of-line (FEOL) region. It should be noted that while planar transistors 110, 120 are illustrated in FIG. 1A, the disclosure is not limited thereto, and other types of transistor (e.g., GAA, FinFET, etc.) are also contemplated within the scope of the disclosure. Similarly, devices other than transistors (e.g., inductors, resistors, capacitors, diodes, and so on) may also be part of the semiconductor device D10.

In some embodiments, the lower interconnection tiers 130, 140, 150 of an interconnection region (IN) are formed on the substrate region SB. In some embodiments, the tiers 130, 140, 150 of the interconnection region (IN) include interlayer dielectrics 132, 142, 152 and conductive patterns 134, 144, 154, 156 disposed on the corresponding interlayer dielectrics 132, 142, 152. For example, the bottommost tier 130 includes the interlayer dielectric 132 disposed on the semiconductor substrate 100 and the conductive patterns 134 disposed on and through the interlayer dielectric 132. The conductive patterns 134 may include routing traces 135 and interconnect vias 136. The routing traces 135 may extend horizontally (e.g., in the XY plane, substantially parallel to the semiconductor substrate 100) on the interlayer dielectric 132, while the interconnect vias 136 may extend vertically (in the Z direction) through the interlayer dielectric 132 to establish electrical connection between the routing traces 135 and the devices (e.g., the transistors 110, 120) formed in the substrate region SB. Similarly, the second tier 140 of the interconnection region IN is stacked on the bottommost tier 130, and also includes an interlayer dielectric 142 and conductive patterns 144. The conductive patterns 144 may include routing traces 145 and interconnect vias 146 extending through the interlayer dielectric 142 to establish electrical connection between the routing traces 135 and the routing traces 145. Additional tiers 150 may be stacked on the lowest tiers 130, 140, each tier of the additional tiers 150 including its own interlayer dielectric 152 and conductive patterns 154 (schematically represented by dots in FIG. 1A). In some embodiments, the conductive patterns 134, 144, 154, 156 may be referred to as metallization levels of the interconnection region IN, and may be sequentially numbered starting from $M_0$ for the metallization level closest to the semiconductor substrate 100. For example, the conductive patterns 134 may be referred to as metallization level $M_0$ and the conductive patterns 144 may be referred to as a metallization level $M_1$. Depending on the number of additional tiers 150, the conductive patterns 154 may be referred to as metallization levels $M_2$ to $M_{n-1}$, and the conductive patterns 156 of the topmost additional tier 150 may be referred as an $n^{th}$ metallization level $M_n$. In some embodiments, n can be an integer in the range from 4 to 15.

In some embodiments, the interlayer dielectrics 132, 142, 152 may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the interlayer dielectrics 132, 142, 152 may be fabricated to a suitable thickness by flowable CVD (FCVD), CVD, HDPCVD, SACVD, spin-on, sputtering, or other suitable methods. In some embodiments, the interlayer dielectric of a tier (e.g., the interlayer dielectric 132 of the tier 130) may be formed during multiple steps and be constituted by two or more layers which may include the same or different dielectric materials. In some embodiments, the conductive patterns 134, 144, 154, 156 may include aluminum, titanium, copper, nickel, tungsten, and/or alloys thereof, and may be fabricated through a sequence of deposition (e.g., CVD, plating, or other suitable processes) and planarization steps (e.g., chemical mechanical polishing). In some embodiments, the tiers 130, 140, 150 of the interconnection region IN may be formed via damascene, dual damascene, or other suitable processes. The position (in terms of level height with respect to the semiconductor substrate 100) of the boundaries between the interlayer dielectrics 132, 142, 152 may depend on the process followed for the formation of the interconnection region IN.

Figure 1B:
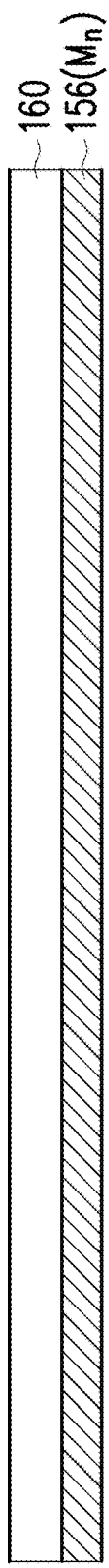

In some embodiments, as illustrated in the following, transistors (e.g., T10 illustrated in FIG. 1J) may be formed in a portion of the interconnection region IN. In some embodiments, the transistors T10 may be integrated in memory cells (e.g., the memory cells MC10 illustrated in FIG. 1L) and the region of the interconnection structure IN where the memory cells are located may be referred to as a memory region MR10 of the semiconductor device D10. For clarity of illustration, in the schematic cross-sectional views of FIG. 1B to FIG. 1L is illustrated only a portion of the memory region MR10, and the elements below the conductive patterns 156 are omitted from the drawings. Referring to FIG. 1A and FIG. 1B, an interlayer dielectric 160 is formed on the topmost additional tier 150, covering the conductive patterns 156. In some embodiments, the interlayer dielectric 160 may be patterned so as to include openings outside of the memory region MR10, to allow electrical connection with the conductive patterns 134, 144, 154, 156 of the lower interconnection tiers 130, 140, 150.

Figure 1C:
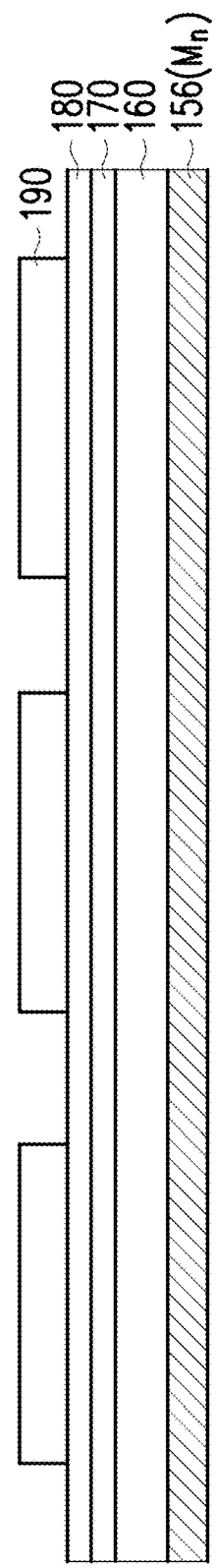

As illustrated in FIG. 1C, a semiconductor channel layer 170 is formed on the interlayer dielectric 160 within the memory region MR10. In some embodiments, the semiconductor channel layer 170 includes a semiconductor oxide material. In some embodiments, the semiconductor channel layer 170 includes a ternary or higher (e.g., quaternary and so on) semiconductor oxide material, such as indium gallium zinc oxide (IGZO), indium zinc oxide (IZO), or indium tin oxide (ITO). In some embodiments, the material of the semiconductor channel layer 170 may be deposited by suitable techniques, such as CVD, ALD, PVD, PECVD, epitaxy, or the like. Thereafter, a high-k dielectric layer 180 is deposited, blanketly covering the semiconductor channel layer 170. In some embodiments, the material of the high-k dielectric layer 180 has a dielectric constant greater than about 4, greater than about 12, greater than about 16, or even greater than about 20. For example, a material of the high-k dielectric layer 180 may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof. In some alternative embodiments, the high-k dielectric layer 180 may optionally include a silicate such as HfSiO, HfSiON LaSiO, AlSiO, or a combination thereof. In some embodiments, the method of forming the high-k dielectric layer 180 includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

Figure 1D:
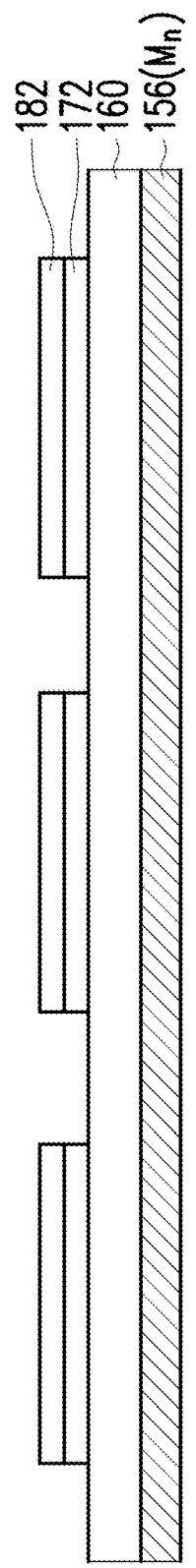

In some embodiments a patterned mask 190 is provided on the high-k dielectric layer 180. In some embodiments, the patterned mask 190 includes a material conferring etching selectivity with respect to at least the high-k dielectric layer 180. In some embodiments, the patterned mask 190 may be an oxide- or nitride-based hard mask. In some alternative embodiments, the patterned mask 190 may include a photoresist material. In some embodiments, the patterned mask 190 may be provided through a sequence of deposition, exposure, and development steps. The patterned mask 190 may include separate blocks or strips which are used to determine the shape of the channel of the transistors during a subsequent etching process. As illustrated with reference to FIG. 1C and FIG. 1D, the pattern of the patterned mask 190 is transferred to the underlying high-k dielectric layer 180 and semiconductor channel layer 170, resulting in one or more channel strips 172 having a high-k dielectric strip 182 disposed on top. In some embodiments, an array of stacks including a channel strip 172 and a high-k dielectric strip 182 is formed within the memory region MR10. The stacks may be disposed along columns and rows of an array. The separation between adjacent stacks may be selected as a function of the footprint of the channel strips 172. In FIG. 1D three stacks of channel strips 172 and high-k dielectric strips 182 are illustrated in the memory region MR10 to represent a plurality of such stacks that are formed in the memory region MR10. The disclosure does not limit the number of channel strips 172 which may be formed within the memory region MR10, and fewer or more channel strips 172 than the ones illustrated in the drawings are contemplated within the present disclosure.

Figure 1E:
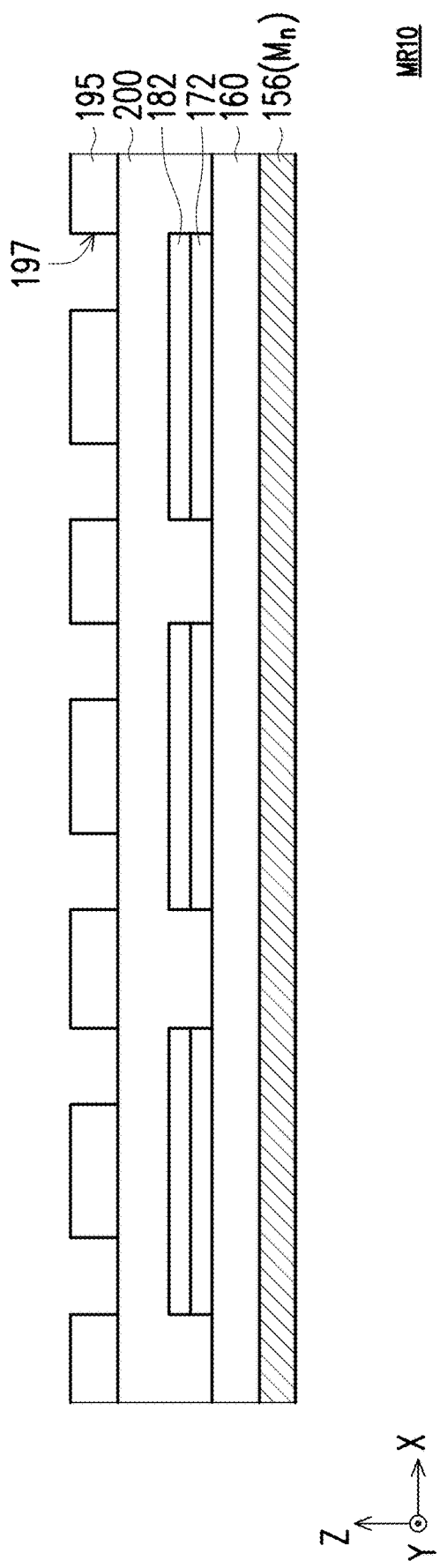
Figure 1F:
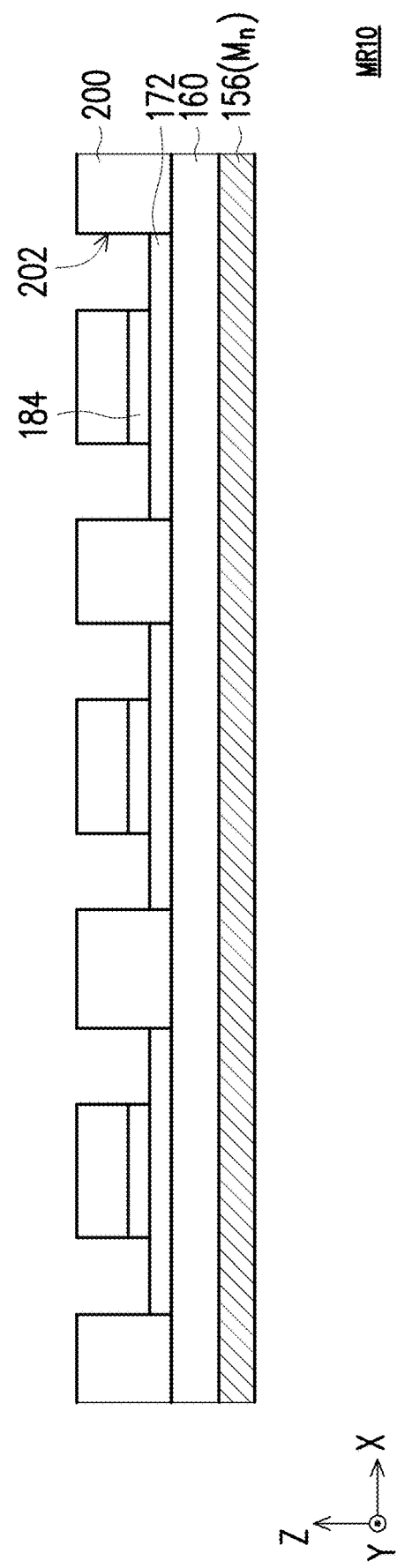

Referring to FIG. 1E, an interlayer dielectric 200 is provided on the interlayer dielectric 160 to encapsulate the channel strips 172 and the high-k dielectric strips 182. In some embodiments, the interlayer dielectric 200 may be further formed on the interlayer dielectric 160 outside the memory region MR10. In some embodiments, the interlayer dielectric 200 is deposited so as to initially bury the high-k dielectric strips 182. That is, the side surfaces of the channel strips 172 and the top and side surfaces of the high-k dielectric strips 182 may be covered by the interlayer dielectric 200. Another patterned mask 195 may be provided on the interlayer dielectric 200. Material and processes to form the patterned mask 195 may be similar to the ones previously described for the patterned mask 190 (illustrated, e.g., in FIG. 1C). In some embodiments, the patterned mask 195 includes mask openings 197 exposing portions of the interlayer dielectric 200 overlying different regions of the channel strips 172 and the high-k dielectric strips 182. For example, if the channel strips 172 and the high-k dielectric strips 182 are strips elongated along the X direction, a pair of openings 197 may overlay the same channel strip 172 and high-k dielectric strip 182. One opening 197 of the pair may overlay one end of the channel strip 172 and the high-k dielectric strip 182, and the other opening 197 of the pair may overlay the other end of the same channel strip 172 and high-k dielectric strip 182. Referring to FIG. 1E and FIG. 1F, the pattern of the patterned mask 195 may be transferred to the interlayer dielectric layer 200 and the high-k dielectric strips 182, for example during one or more etching steps. That is, portions of the interlayer dielectric 200 exposed by the openings 197 and the underlying portions of the high-k dielectric strips 182 may be removed to form openings 202 exposing the channel strips 172 at the bottom. Upon formation of the openings 202, shortened high-k dielectric strips 184 remains on the channel strips 172, and the channel strips 172 may protrude on both sides in an elongating direction (e.g., the X direction) with respect to the overlying shortened high-k dielectric strips 184. In some embodiments, each channel strip 172 is exposed at the bottom of at least two openings 202, with one end of the channel strip 172 exposed by one opening 202 and another end of the channel strip 172 exposed by the other opening 202. The high-k dielectric strips 184 may be exposed along the sidewalls of the openings 202.

Figure 1G:
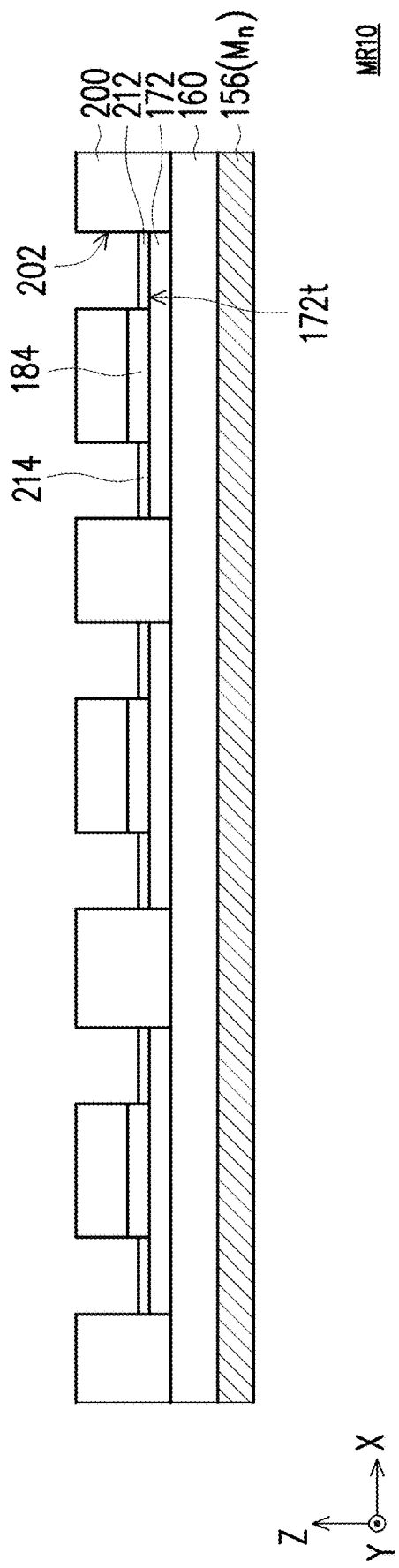

Referring to FIG. 1G, self-assembled monolayers 212, 214 are formed at the bottom of the openings 202 on the exposed portions of the channel strips 172. In some embodiments, the self-assembled monolayers 212, 214 have a thickness in the Z direction in the range from 1 to 50 monolayers. In some embodiments, excess material that is deposited during formation of the self-assembled monolayers 212, 214 may be removed until the self-assembled monolayers 212, 214 reach the desired thickness. In some embodiments, at least one self-assembled monolayer 212, 214 remains on the channel strips 172. In some embodiments, the self-assembled monolayers 212, 214 include an organic material which is at least partially adsorbed on the exposed surface of the channel strips 172. In some embodiments, the organic material forms covalent bonds with surface atoms of the channel strips 172. In some alternative embodiments, the organic material forms intermolecular bonding (e.g., electrostatic interactions between ionized groups, dipole-dipole interactions, hydrogen bonds, or other types of weak bonding) to the surface atoms of the channel strips 172. In some embodiments, the organic material includes amphiphilic molecules, having a polar group and a hydrophobic chain. In some embodiments, the hydrophobic chain is an aliphatic chain. In some embodiments, the hydrophobic chain is an alkylene chain having 1 to 20 carbon atoms. For example, the alkylene chain may correspond to the chain imaginarily obtained by removing two hydrogens from a straight or branched alkane, such as from methane, ethane, propane, butane, pentane, hexane, heptane, octane, nonane, decane, undecane, dodecane, tridecane, tetradecane, pentadecane, hexadecane, heptadecane, octadecane, nonadecane, or icosane. In some embodiments, the alkylene chain is a straight alkylene chain. In some embodiments, the polar group bonds (covalently or intermolecularly) to the surface atoms of the channel strips 172, while the hydrophobic chains project away from the channel strips 172. In some embodiments, the polar group includes a hydroxy group, a carboxy group, a thiol group, an amino group, a silanol group, or the like. In some embodiments, the organic material includes a bifunctional or polyfunctional compound, having at least two polar groups, one of which is capable of binding to the surface atoms of the channel strips 172 and the other is capable of binding to the surface atoms of the channel strips 172 and/or to the material of the successively formed source and drain contacts.

In some embodiments, the organic material includes a compound selected from an alkylamine, an alkanethiol, an alkyl-trialkoxysilane, an aliphatic carboxylic acid, and a thioalkyl-carboxylic acid. Examples of alkylamines include compounds of formula $NR_2L$, where R is hydrogen or an alkyl group having 1 to 20 carbon atoms, and L is an alkyl group having 1 to 20 carbon atoms. In some embodiments, the alkylamine is a primary aliphatic amine such as hexylamine, heptylamine, octylamine, or the like. Examples of alkanethiols include compounds of formula $CH_3(CH_2)_nSH$, where n can be in the range from 1 to 5, such as 1-hexanethiol, or the like. Examples of alkyl-trialkoxysilane include compounds of formula $SiR_3L$, where each R is independently an alkoxy group having a chain of 1 to 20 carbon atoms, and L is an alkylene chain having 1 to 20 carbon atoms, for example n-octyl-trimethoxysilane. Examples of aliphatic carboxylic acids includes compounds of formula $CH_3(CH_2)_n COOH$, where n can be in the range from 1 to 5, such as propionic acid, butyric acid, or the like. Examples of thioalkyl-carboxylic acids include compounds of formula $SH(CH_2)_n COOH$, where n can be in the range from 1 to 5, such as 6-thiohexanoic acid.

In some embodiments, the self-assembled monolayers 212, 214 may be formed according to any suitable protocol. For example, the channel strips 172 to be functionalized may be exposed to the organic material in liquid state, for example by immerging the system in the neat liquid of the organic material or in a solution of the organic material in a suitable solvent. In some embodiments, inert or scarcely reactive solvents such as alkanes may be used to prepare the solutions of organic material. In some alternative embodiments, the functionalization may be performed via vapor-deposition. In some embodiments, the functionalization protocol may be chosen as a function of the organic material selected to be included in the self-assembled monolayers 212, 214. In some embodiments, the organic material of the self-assembled monolayers 212, 214 may passivate oxygen vacancies at the surface of the channel strips 172. Depending on the functional groups included, the organic material may bind specifically to metal atoms (such as In, Ga, Zn, Sb) included in the channel strips 172, so as to form a closed layer. In some embodiments, the organic material may selectively bind to the semiconductor oxide of the channel strips 172, so that the self-assembled monolayers 212, 214 are selectively formed on the top surfaces 172t of the channel strips 172 expose at the bottom of the openings 202. In some embodiments, the organic material does not bind to the interlayer dielectric 200 or the high-k dielectric strip 184.

Figure 1H:
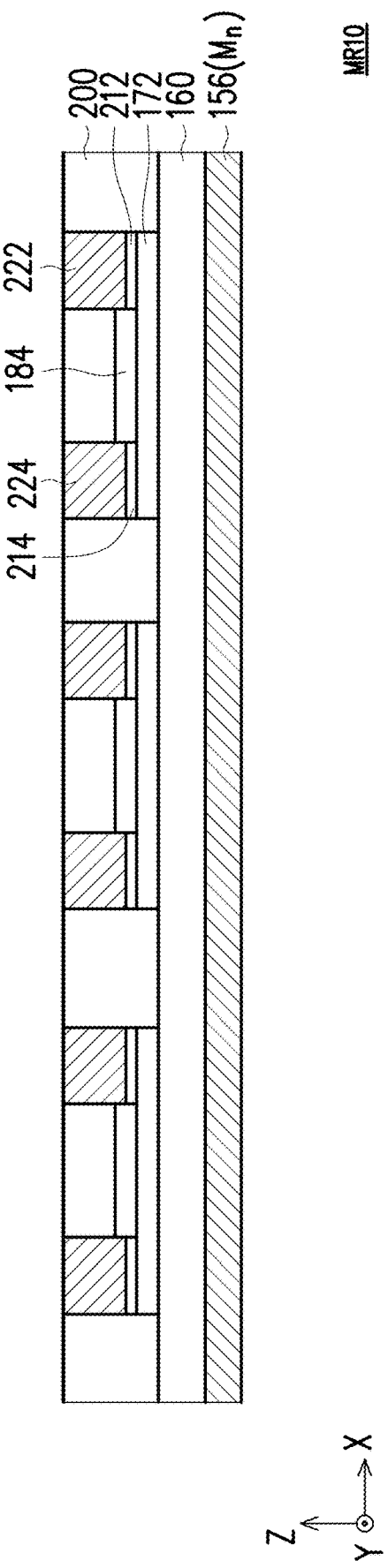

Referring to FIG. 1G and FIG. 1H, in some embodiments a metallic material is filled in the openings 202 on top of the self-assembled monolayers 212, 214 to form source and drain contacts 222, 224, respectively. In some embodiments, the metallic material of the source and drain contacts 222, 224 may include aluminum, titanium, copper, nickel, tungsten, and/or alloys thereof, and be formed through CVD, ALD, plating or other suitable deposition techniques. In some embodiments, the source and drain contacts 222, 224 are formed by filling the openings 202 with the metallic material, with the metallic material initially covering also the top surface of the interlayer dielectric 200. A planarization process may then be performed to remove part of the metallic material, leaving the source and drain contacts 222, 224 filling the openings 202 and exposing elsewhere the interlayer dielectric 200. In some embodiments, by having the self-assembled monolayers 212, 214 in between the channel strip 172 and the source and drain contacts 222, 224, contact oxidation or degradation may be reduced, thus lowering the contact resistance between the channel strip 172 and the source and drain contacts 222, 224. In some embodiments, the self-assembled monolayers 212, 214 passivate vacancies and dangling bonds in the material of the channel strips 172, thus lowering the contact resistance.

Figure 1I:
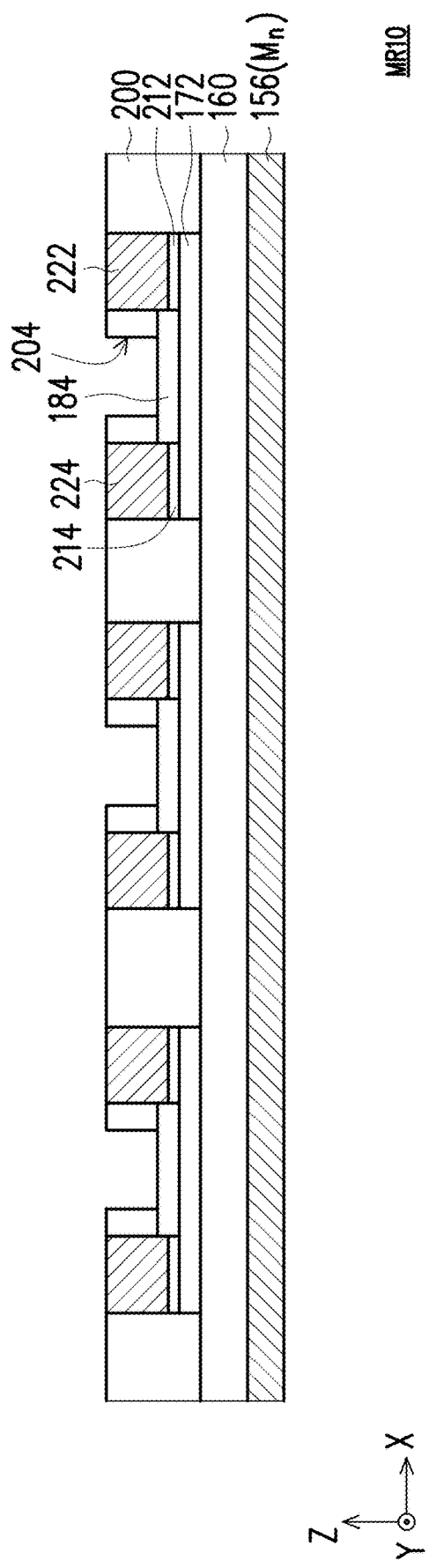
Figure 1J:
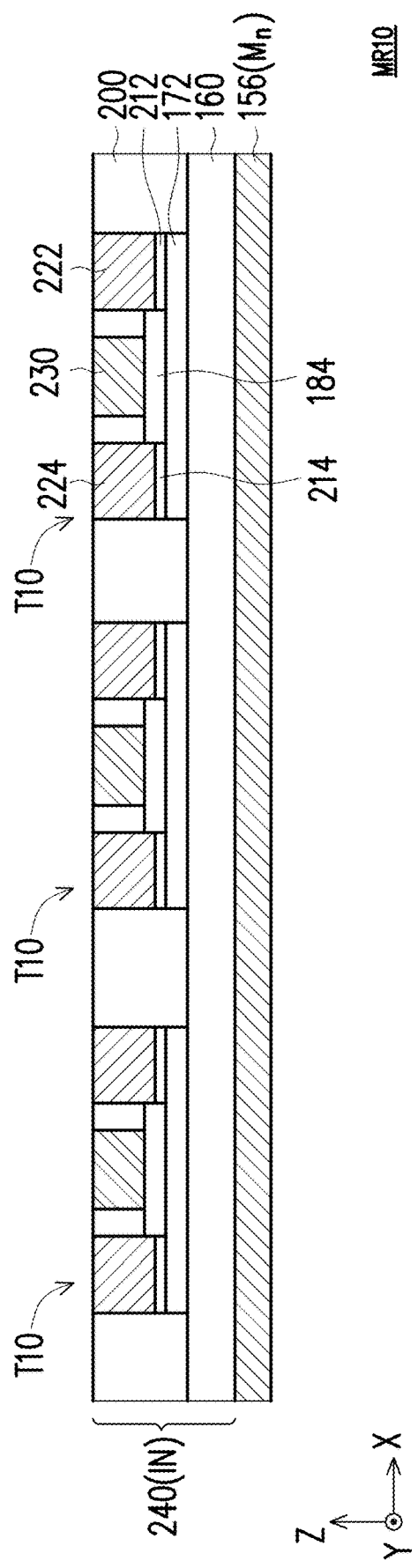

Referring to FIG. 1I, openings 204 are formed in the interlayer dielectric 200 in between pairs of source and drain contacts 222, 224 formed on a same channel strip 172. In some embodiments, the openings 204 expose portions of the high-k dielectric strip 184 overlying the channel strip 172. In some embodiments, the openings 204 are trenches elongated along the Y direction, and each opening 204 may expose multiple high-k dielectric strips 184 overlying corresponding channel strips 172. As illustrated in FIG. 1I, multiple openings 204 may be formed extending substantially parallel to each other along the Y direction. Patterned mask (not shown) may be used to form the openings 204, similar to what was previously described for the openings 202 (illustrated, e.g., in FIG. 1G). Referring to FIG. 1I and FIG. 1J, a metallic material is deposited in the openings 204 to form gate patterns 230 separated from the channel strips 172 by the high-k dielectric strips 184. In some embodiments, the metallic material of the gate patterns 230 includes copper (Cu), titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate patterns 230 may also include materials to fine-tune the corresponding work function. For example, the metallic material of the gate patterns 230 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, the metallic material of the gate patterns 230 is formed so as to fill the openings 204 and initially further cover surrounding portions of the interlayer dielectric 200. A planarization process (such as CMP) may be performed to remove excess metallic material, leaving the gate patterns 230 within the openings 204. In some embodiments, a channel strip 172 having a high-k dielectric strip 184 and a gate pattern 230 disposed in between a pair of source and drain contacts 222, 224 may form a transistor T10. The tier 240 in which the transistors T10 are formed may be sometimes referred to as an active device tier.

In some embodiments, one of the metallic materials deposited in the openings 202 or 204 in the memory region MR10 is part of the metallization level $M_{n+1}$, so that the metallic material may be deposited also outside the memory region MR10, to form conductive interconnection patterns through the interlayer dielectrics 200 and 160. In some alternative embodiments, both the metallic materials deposited in the memory region MR10 for the source and drain contacts 222, 224 and the gate patterns 230 are different from the metallic material deposited outside of the memory region MR10 to form the conductive interconnection patterns.

Figure 1K:
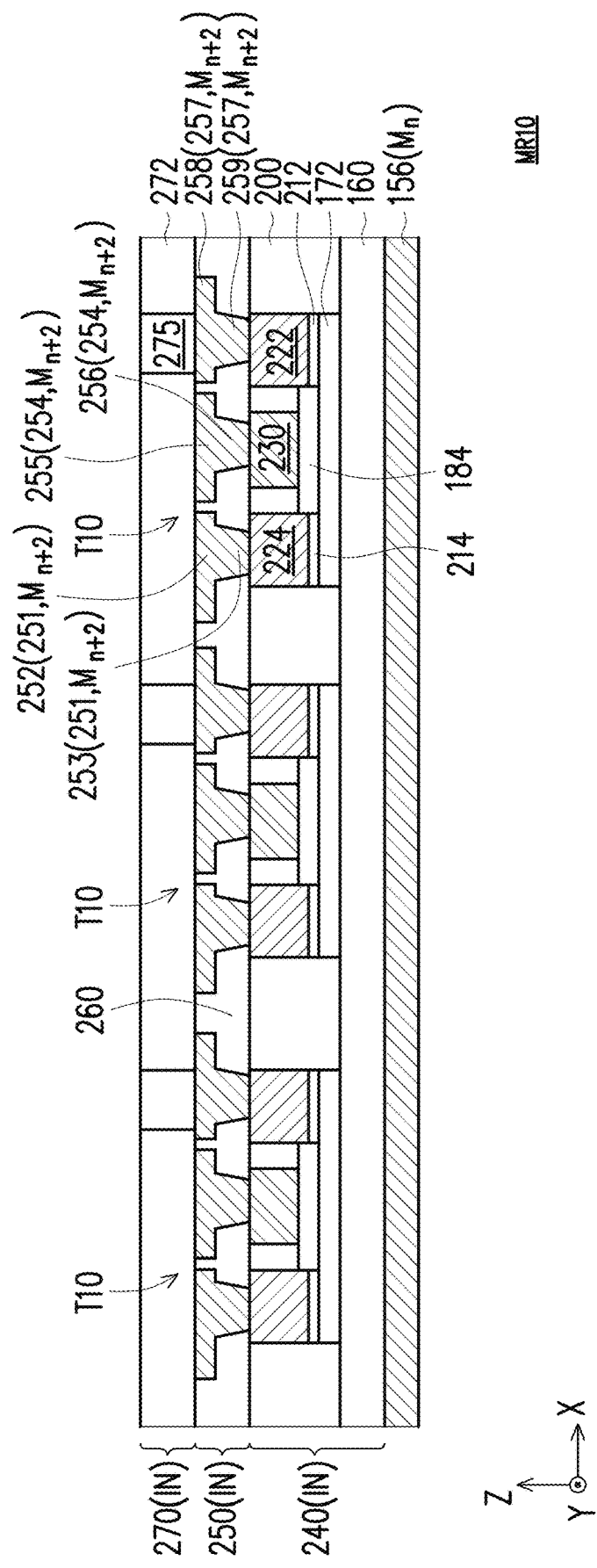

Referring to FIG. 1K, a connection tier 250 and a magnetic junction tier 270 may be sequentially formed on the active device tier 240. In the memory region MR10, the connection tier 250 includes conductive patterns 251, 254, 257 formed in an interlayer dielectric 260. In some embodiments, the conductive patterns 251, 254, 257 are connected to the source contacts 224, the gate patterns 230, and the drain contacts 222 of the transistors T10, respectively. In some embodiments, the conductive patterns 251, 254, 257 belong to the metallization level $M_{n+2}$, two level higher with respect to the metallization level $M_n$ on which the transistors T10 are formed. The conductive patterns 251 may include routing traces 252 and conductive vias 253 connecting the routing traces 252 to the source contacts 224. Similarly, the conductive patterns 254 may include routing traces 255 connected to the gate patterns 230 by conductive vias 256. The conductive patterns 257 may include conductive plates 258 connected to the drain contacts 222 by conductive vias 259. The conductive patterns 251, 254, 257 may be separated from each other by portions of the interlayer dielectric 260.

In some embodiments, the magnetic junction tier 270 includes magnetic tunnel junctions 275 embedded in an interlayer dielectric 272 in correspondence of the memory region MR10. In some embodiments, the drain contacts 222 are connected by the conductive patterns 257 to the magnetic tunnel junctions 275. In some embodiments, the magnetic tunnel junctions 275 may be disposed on the conductive plates 258 of the connection tier 250, one magnetic tunnel junction 275 per conductive plate 258. In some embodiments, the connection tier 250 and the magnetic junction tier 270 may further include interconnection conductive patterns (not shown) outside the memory region MR10.

Figure 1L:
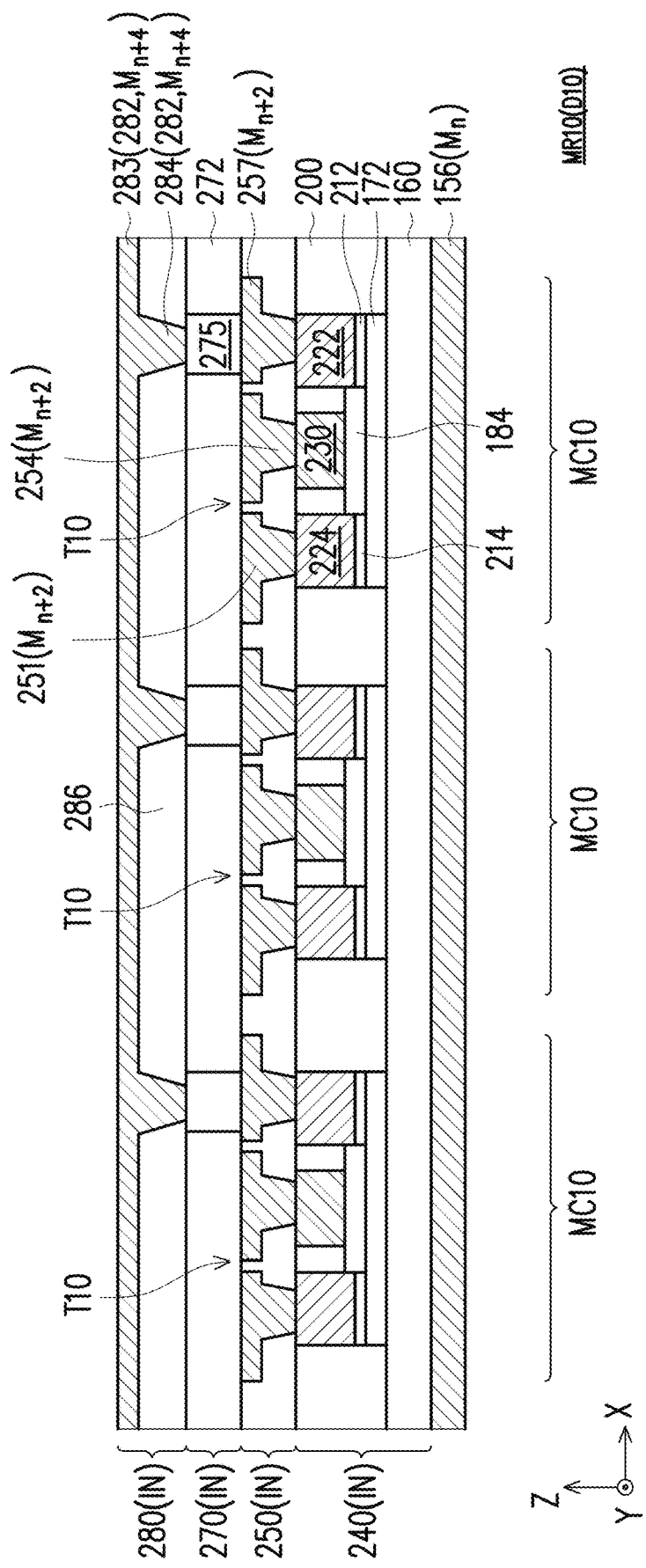

Referring to FIG. 1L, one or more upper tiers of the interconnection region IN are formed on the magnetic junction tier 270. In some embodiments, at least one of the upper tiers (e.g., the upper tier 280) includes conductive patterns 282 contacting multiple magnetic tunnel junctions 275. For example, the conductive patterns 282 belonging to the metallization level $M_{n+4}$ may include conductive strips 283 extending parallel to each other along the X direction, and one of such conductive strips 283 may be connected by conductive vias 284 to magnetic tunnel junctions 275 disposed as a row extending along the X direction, at a same level height along the Y direction. In In some embodiments, the conductive strips 283 may be separated from each other along the Y direction by portions of the interlayer dielectric 286. In some embodiments, further processes (e.g., post-fab processes) may be performed after formation of the upper tiers of the interconnection region IN.

Figure 1M:
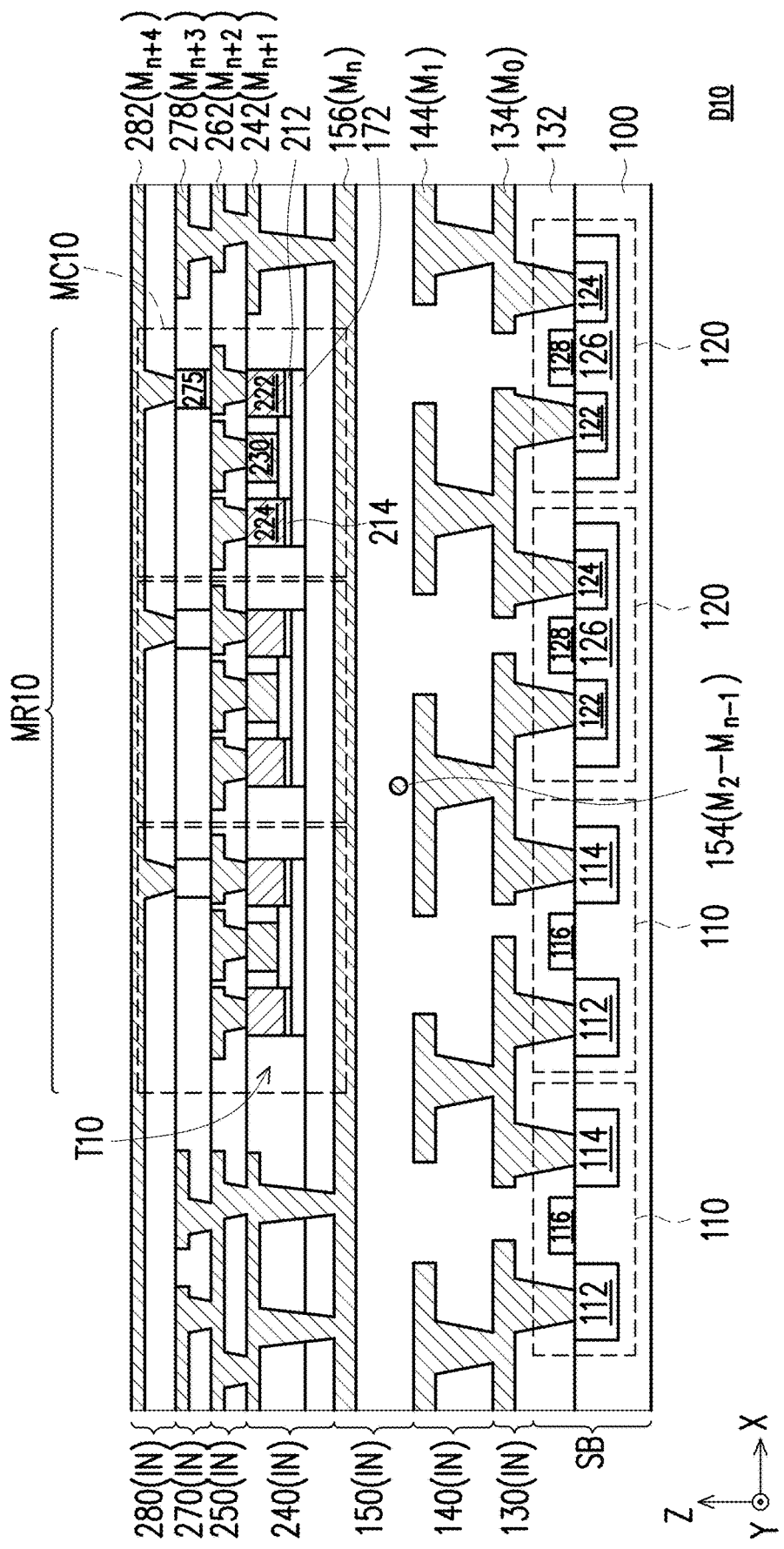

FIG. 1M is a schematic cross-sectional view of the semiconductor device D10 according to some embodiments of the disclosure. Referring to FIG. 1L and FIG. 1M, the semiconductor device D10 includes the substrate region SB and the interconnection region IN formed on the substrate region SB. In the substrate region SB, active and passive devices (e.g., the transistors 110, 120) are formed in the semiconductor substrate 100. The devices formed in the semiconductor substrate 100 may be electrically connected to each other by the conductive patterns (e.g., 134, 144 and so on) of the interconnection region IN, so as to be part of an integrated circuit. In some embodiments, the semiconductor device D10 includes at least one transistor T10 formed on the conductive patterns 156 of a metallization level $M_n$ of the interconnection region IN (a back-end-of-line transistor). The transistor T10 includes the channel strip 172, the high-k dielectric strip 184, the gate pattern 230, and at least a pair of source and drain contacts 222, 224 disposed at opposite sides of the gate pattern 230 on the channel strip 172. Self-assembled monolayers 212, 214 are formed on the channel strip 172, and are disposed between the channel strip 172 and the source and drain contacts 222, 224. Conductive patterns 251, 254, 257 of the interconnection region IN may integrate the transistor T10 within larger circuits.

For example, the semiconductor device D10 may include a memory region MR10 located within the interconnection region IN. In the memory region MR10, an array of memory cells MC10 is formed. Each memory cell MC10 includes a transistor T10 and a magnetic tunnel junction 275. That is, the semiconductor device D10 may be or include a high-density non-volatile memory such as a magneto-resistive random-access memory (MRAM), a resistive random-access memory (RRAM), a phase-change random-access memory (PCRAM), a conductive bridging random-access memory (CBRAM), or the like. The drain contact 222 of the transistor T10 and the magnetic tunnel junction 275 may be connected by the conductive patterns (e.g., the conductive patterns 257) of one or more connection tiers 250 of the interconnection region IN. In the semiconductor device D10, there is one connection tier 250 joining the transistors T10 to the overlying magnetic tunnel junctions 275, but the disclosure is not limited thereto. In some alternative embodiments, conductive patterns of multiple connection tiers may connect the drain contact 222 to the magnetic tunnel junction 275. The source contact 224 and the gate pattern 230 may be contacted by dedicated connection patterns 251, 254, also formed in the connection tier 250.

In some embodiments, the source and drain contacts 222, 224, the gate patterns 230, or both may be formed in the memory region M10 together (during a same deposition step) with the interconnection conductive patterns 242 of the metallization level $M_{n+1}$. Similarly, the conductive patterns 251, 254, 257 may be formed together with the interconnection conductive patterns 262 of the metallization level $M_{n+2}$. The interconnection conductive patterns 242, 262, together with the interconnection conductive patterns 278 of the magnetic junction tier 270, are disposed outside the memory region MR10, and may serve to interconnect the memory cells MC10 to other devices of the semiconductor device D10, or may interconnect the other devices to perform different logic functions. A magnetic tunnel junction 275 is formed for each memory cell MC10, and is contacted by one of the conductive patterns 282 of a higher metallization level (e.g., the metallization level $M_{n+4}$). The conductive strips 283 extend along the X direction, substantially perpendicular to the gate patterns 230 extending along the Y direction. In some embodiments, a conductive strip 283 may contact the magnetic tunnel junctions 275 located at a same level height along the Y direction. In some embodiments, the transistor T10 acts as selector for the magnetic tunnel junction 275 of the same memory cell MC10. That is, the gate patterns 230 may correspond to the word lines of the memory (e.g., MRAM, etc.), and the conductive strips 283 to bit lines of the memory (e.g., MRAM, etc.). In some embodiments, by using the transistor T10 as selector for the memory cell MC10, high write current required to operate memories such as MRAMs, RRAMs, PCRAMs, CBRAMs, etc., may be achieved without increasing the transistor density on the semiconductor substrate 100. Indeed, in some embodiments, the transistors 110, 120 formed on the semiconductor substrate 100 may be used to perform different logic functions than regulating access to the memory. In some embodiments, by disposing self-assembled monolayers 212, 214 in between the channel strips 172 and the source and drain contacts 222, 224, the contact resistance of the transistors T10 may be reduced, resulting in shorter response times of the circuits in which the transistors T10 are integrated. In some embodiments, the reduced distance between the transistor T10 (the selector) and the magnetic tunnel junction 275 may also increase the response speed of the memory cell M10. In some embodiments, by employing oxide semiconductors for the channel strips 172, fabrication of the transistors T10 may be smoothly integrated with the back-end-of-line processes to form the interconnection region IN. Furthermore, the transistors T10 may achieve good performances, for example in terms of ultra-low current leakage.

It should be noted that while in some of the drawings, the transistors T10 are illustrated as integrated in high-density memories such as an MRAMs, RRAMs, PCRAMs, CBRAMs, etc., the disclosure is not limited thereto. In some alternative embodiments, the back-end-of-line transistors may not be integrated within memory cells, but rather be used to perform some different logic, such as controlling electrodes of a display, or the like. It is understood that while in the following disclosure applications related to memories are illustrated, the disclosure does not limit the back-end-of-line transistors to be integrated within memory cells.

FIG. 2A to FIG. 2F are schematic cross-sectional views of structures produced during a manufacturing method of a semiconductor device D20 according to some embodiments of the disclosure. The semiconductor device D20 may be similar to the semiconductor device D10 of FIGS. 1M and 1t is understood that similar material and processes as described above may be used for fabricating corresponding elements of the two devices. In some embodiments, the structure of FIG. 2A may be fabricated starting from a structure such as the one of FIG. 1A. For clarity of illustration, in the remaining drawings of the disclosure are illustrated only portions of the memory regions (e.g., the memory region MR20 in FIG. 2A), and the substrate region SB and the lower interconnection tiers 130, 140, 150 are omitted. In some embodiments, the portions of the structures not illustrated in the drawings (e.g., below the conductive patterns 1156 illustrated in FIG. 2A) may be similar to the structures in FIG. 1A and in FIG. 1M.

Figure 2A:
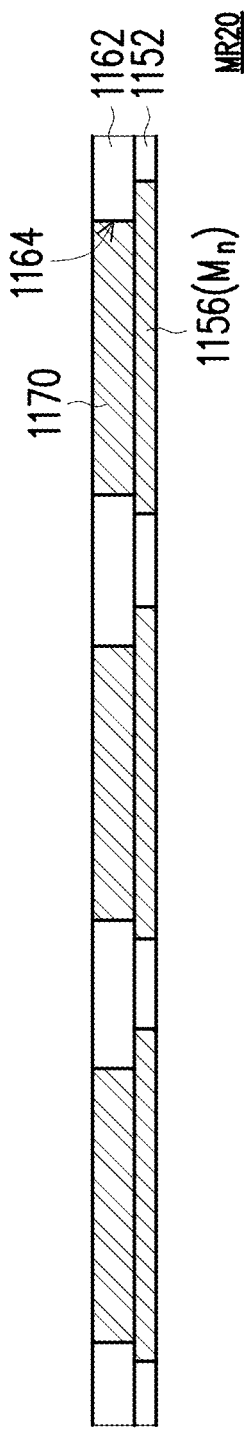
FIG. 2A to FIG. 2F are schematic cross-sectional views of structures formed during a manufacturing process of a semiconductor device in accordance with some embodiments of the disclosure.
Figure 2B:
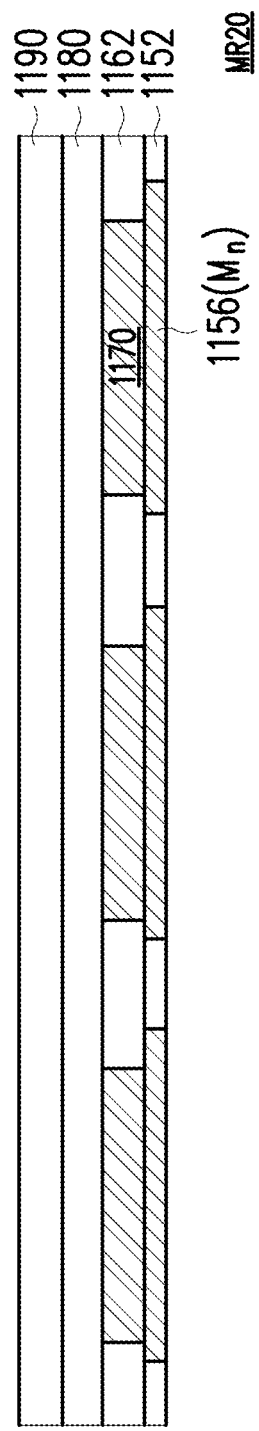
Figure 2C:
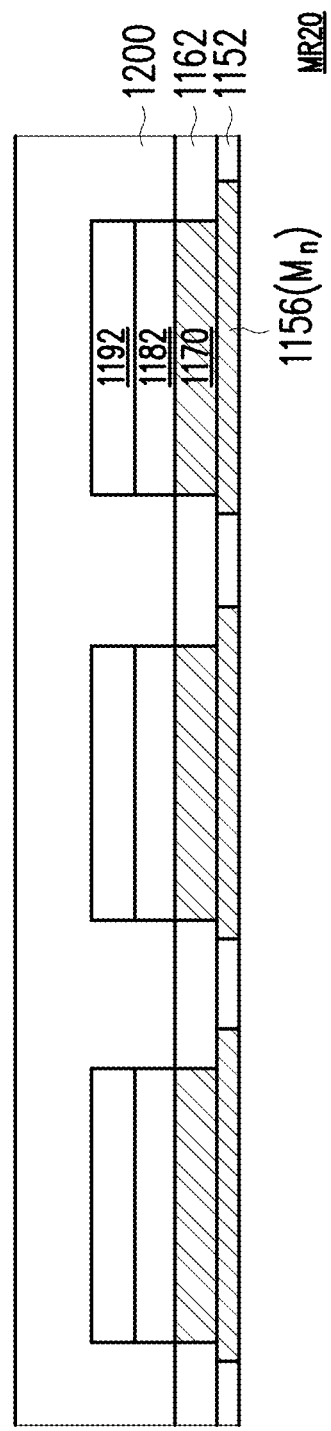
Figure 2D:
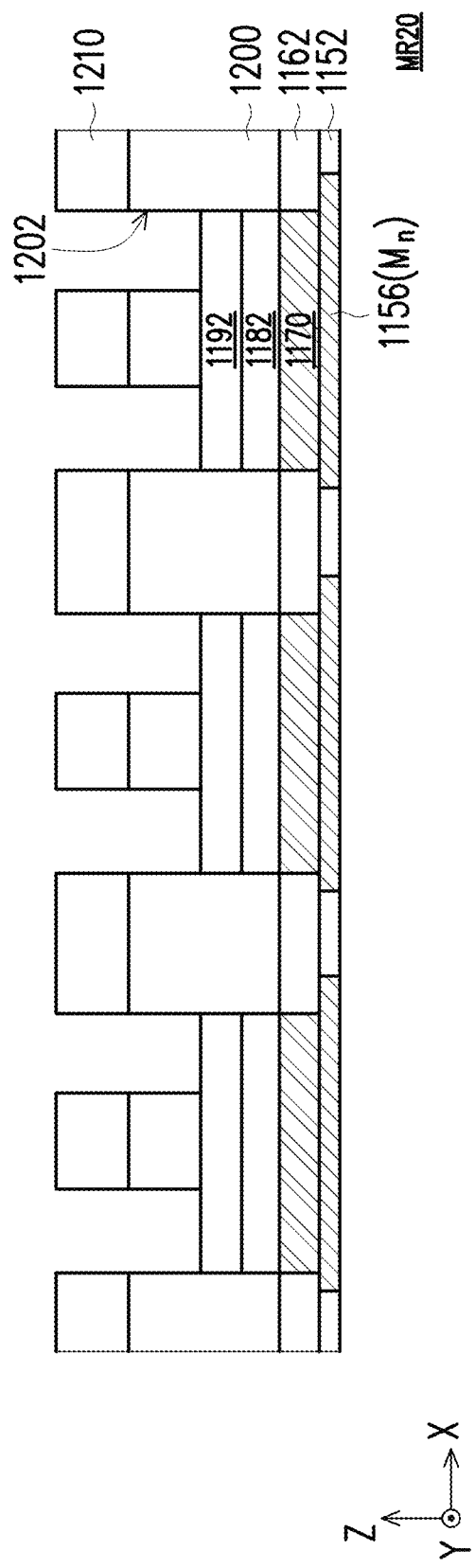
Figure 2E:
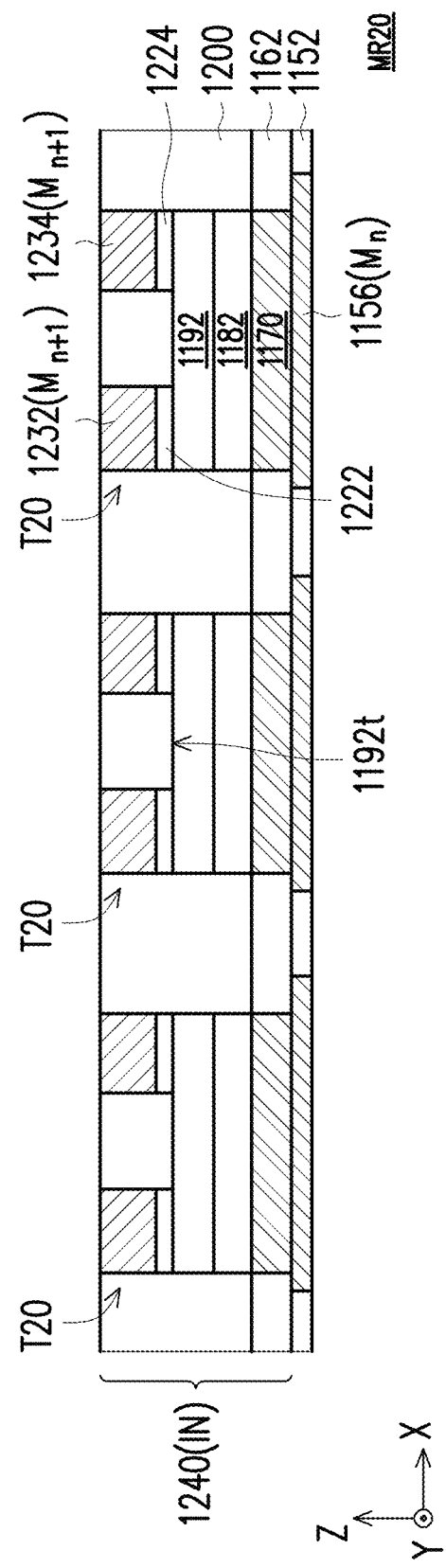
Figure 2F:
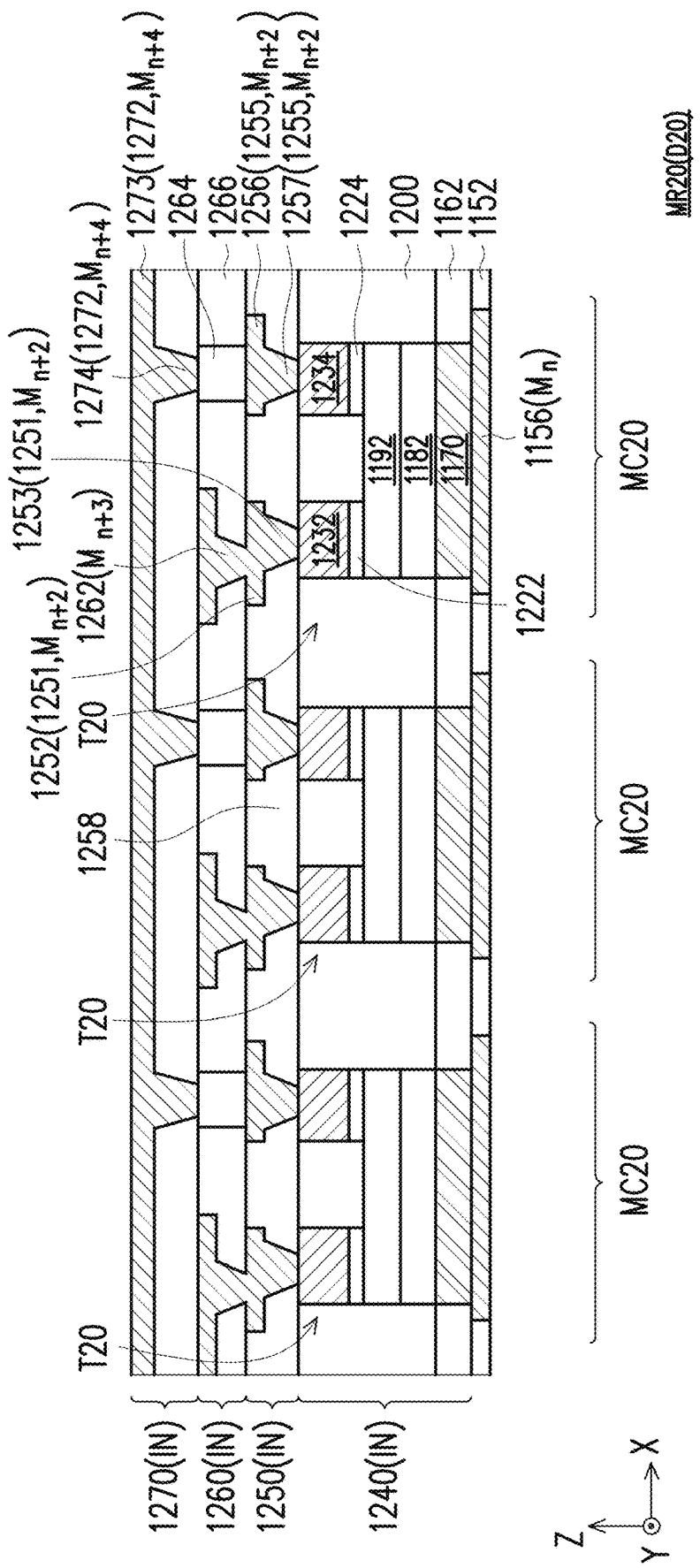

In some embodiments, the conductive patterns 1156 belong to the metallization level $M_n$ of an interconnection region IN (a portion of which is illustrated, e.g., in FIG. 2F). In some embodiments, n may be an integer in the range from 4 to 15. In some embodiments, an interlayer dielectric 1162 is formed on the conductive patterns 1156 and the interlayer dielectric 1152. In some embodiments, the interlayer dielectric 1162 includes a plurality of openings 1164 in the memory region MR20 and the conductive patterns 1156 are exposed at the bottom of the openings 1164. In some embodiments, the openings 1164 in the memory region MR20 are trenches elongated along the Y direction, exposing, at their bottom, portions of conductive patterns 1156. In some embodiments, gate patterns 1170 are formed in the openings 1164 of the interlayer dielectric 1162. The gate patterns 1170 may be conductive strips extending parallel to each other along the Y direction, and separated from each other by portions of the interlayer dielectric 1162. In some embodiments, a metallic material of the gate patterns 1170 may be selected as described above with respect to the gate patterns 230 (illustrated, e.g., in FIG. 1J). In some embodiments, the gate patterns 1170 are formed by filling a metallic material in the openings 1164 of the interlayer dielectric 1162. In some embodiments, the metallic material fills the openings 1164 and further covers the interlayer dielectric 1162. Portion of the metallic material may be removed, for example during a planarization process, until the interlayer dielectric 1162 is exposed, leaving the gate patterns 1170 filling the openings 1164.

Referring to FIG. 2B, a high-k dielectric layer 1180 and a semiconductor channel layer 1190 are sequentially formed on the interlayer dielectric 1162 and the gate patterns 1170, with the high-k dielectric layer 1180 interposed between the gate patterns 1170 and the semiconductor channel layer 1190. In some embodiments, the high-k dielectric layer 1180 and the semiconductor channel layer 1190 blanketly extend on the interlayer dielectric 1162 and multiple gate patterns 1170. Materials and processes for the formation of the high-k dielectric layer 1180 and the semiconductor channel layer 1190 may be selected as previously described. Referring to FIG. 2B and FIG. 2C, the high-k dielectric layer 1180 and the semiconductor channel layer 1190 are patterned to form high-k dielectric strips 1182 and channel strips 1192, respectively. In some embodiments, an array of stacks including a high-k dielectric strip 1182 and a channel strip 1192 is formed in the memory region MR20, with the stacks disposed along the columns and rows of the array. In some embodiments, multiple stacks distributed along the Y direction may be formed on a same gate pattern 1170, and stacks distributed along the X direction may be formed on different gate patterns 1170. An interlayer dielectric 1200 may be formed on the interlayer dielectric 1162, encapsulating the high-k dielectric strips 1182 and the channel strips 1192, separating adjacent stacks from each other.

Referring to FIG. 2D, the interlayer dielectric 1200 is patterned to form openings 1202, by applying a patterned mask 1210 on top of the interlayer dielectric 1200 and transferring the pattern of the patterned mask 1210 to the interlayer dielectric 1200. In some embodiments, the openings 1202 expose at their bottom portions of the channel strips 1192. In some embodiments, at least two different regions (e.g., two ends) of a same channel strip 1192 are exposed by the openings 1202. In some embodiments, different openings 1202 expose different regions of the channel strip 1192. The interlayer dielectric 1200 may extend on a channel strip 1192 in between the openings 1202 formed on the channel strip 1192.

Referring to FIG. 2E, the patterned mask 1210 is removed and self-assembled monolayers 1222, 1224 are formed at the bottom of the openings 1202, on the exposed portions of the top surface 1192t of the channel strips 1192. In some embodiments, a pair of self-assembled monolayers 1222, 1224 is formed on a channel strip 1192, in correspondence of the regions exposed by the openings 1202. Source and drain contacts 1232, 1234 are formed on the self-assembled monolayers 1222, 1224, respectively, within the openings 1202. That is, after formation of the self-assembled monolayers 1222, 1224, the openings 1202 may be filled with the metallic material of the source and drain contacts 1232, 1234. In some embodiments, the source and drain contacts 1232, 1234 belong to the metallization level $M_{n+1}$, and may be formed together with other interconnection conductive patterns outside the memory region MR20. In some embodiments, with formation of the source and drain contacts 1232, 1234, transistors T20 are formed within the memory region MR20. In some embodiments, the transistors T20 include the channel strips 1192 having on one side the source and drain contacts 1232, 1234, and, on an opposite side, the gate pattern 1170. That is, the transistors T20 formed in the active device tier 1240 may be bottom-gated transistors, having the source and drain contacts 1232, 1234 and the gate pattern 1170 in a staggered configuration with respect to the channel strip 1192. In some embodiments, the contact resistance of the transistors T20 may be lowered by having the self-assembled monolayers 1222, 1224 interposed between the channel strip 1192 and the source and drain contacts 1232, 1234.

Referring to FIG. 2F, the semiconductor device D20 may be manufactured from the structure illustrated in FIG. 2E following process steps similar to the ones previously described with reference to FIG. 1K and FIG. 1L. Briefly, one or more connection tiers 1250 are formed on the active device tier 1240. While one connection tier 1250 is illustrated, multiple connection tiers may also be formed, according to routing requirements. The connection tier 1250 includes conductive patterns 1251, 1255 embedded in the interlayer dielectric 1258. The conductive patterns 1251 may include routing traces 1252 and conductive vias 1253 connecting the routing traces 1252 to the source contacts 1232. The conductive patterns 1255 may include conductive plates 1256 connected to the drain contacts 1234 by conductive vias 1257. A magnetic junction tier 1260 is then formed on the connection tier(s) 1250. The magnetic junction tier 1260 includes magnetic tunnel junctions 1264 disposed on the conductive plates 1256. In some embodiments, the magnetic junction tier 1260 may further include conductive patterns 1262 connected to the source contacts 1232 through the conductive patterns 1251. The magnetic junction tier 1260 further includes an interlayer dielectric 1266 in which the magnetic tunnel junctions 1264 and the conductive patterns 1262 are embedded. The interlayer dielectric 1266 may separate the magnetic tunnel junctions 1264 from the conductive patterns 1262. In some embodiments, the magnetic junction tier 1260 further includes interconnection conductive patterns outside of the memory region MR20 which may be connected to conductive patterns of other tiers of the interconnection region IN to perform various logic functions. Upper interconnection tiers are formed on the magnetic junction tier 1260, one of which (e.g., the tier 1270) includes conductive strips 1273 extending in a perpendicular direction with respect to the gate patterns 1170, and connected to the magnetic tunnel junctions 1264 by conductive vias 1274.

The semiconductor device D20 includes the back-end-of-line transistors T20 formed in the interconnection region IN. In some embodiments, the back-end-of-line transistors T20 may be integrated within memory cells MC2. An array of memory cells MC20 may be formed within the memory region MR20. Each memory cell MC20 includes a transistor T20 and an associated magnetic tunnel junction 1264, for which the transistor T20 is configured to act as selector. In some embodiments, the memory cells MC20 may be part of a high-density memory (e.g., an MRAM, etc.), with the gate patterns 1170 configured as word lines and the conductive strips 1273 configured as the bit lines. Both the transistors T20 and the magnetic tunnel junctions 1264 are formed on top of the metallization levels $M_n$ of the interconnection region IN. Therefore, the distance between the transistor T20 (selector) and the magnetic tunnel junction 1264 may be shortened, increasing the response speed of the memory cells MC20. Furthermore, the transistor T20 includes self-assembled monolayers 1222, 1224 disposed between the source and drain contacts 1232, 1234 and the channel strip 1192. Inclusion of the self-assembled monolayers 1222, 1224 may lower the contact resistance of the transistor, further increasing the response speed of the transistor T20. As illustrated in FIG. 2E and FIG. 2F, the source and drain contacts 1232, 1234 may be formed at the metallization level $M_{n+1}$, the magnetic tunnel junctions 1264 at the metallization level $M_{n+3}$, and the conductive patterns 1272 at the metallization level $M_{n+4}$.

In FIG. 2F, the gate patterns 1170 are illustrated as having substantially the same extension in the X direction as the high-k dielectric strips 1182 and the channel strips 1192. Vertical projections along the Z direction of the source and drain contacts 1232, 1234 fall on the gate pattern 1170. However, the disclosure is not limited thereto. In some alternative embodiments, the gate patterns 1170 may be shorter (along the X direction) than the channel strips 1192. For example, there may be only partial overlap between the vertical projections of the source and drain contacts 1232, 1234 and the gate patterns 1170. In some alternative embodiments, the gate pattern 1170 may extend in correspondence of the portion of interlayer dielectric 1200 in between the source and drain contacts 1232, 1234, so that there may be no overlap with the vertical projections of the source and drain contacts 1232, 1234. That is, the relative width along the X direction of the gate patterns 1170 and the overlying channel strips 1192, as well as the positions of the source and drain contacts 1232, 1234 may be selected according to production and routing requirements.

Figure 3:
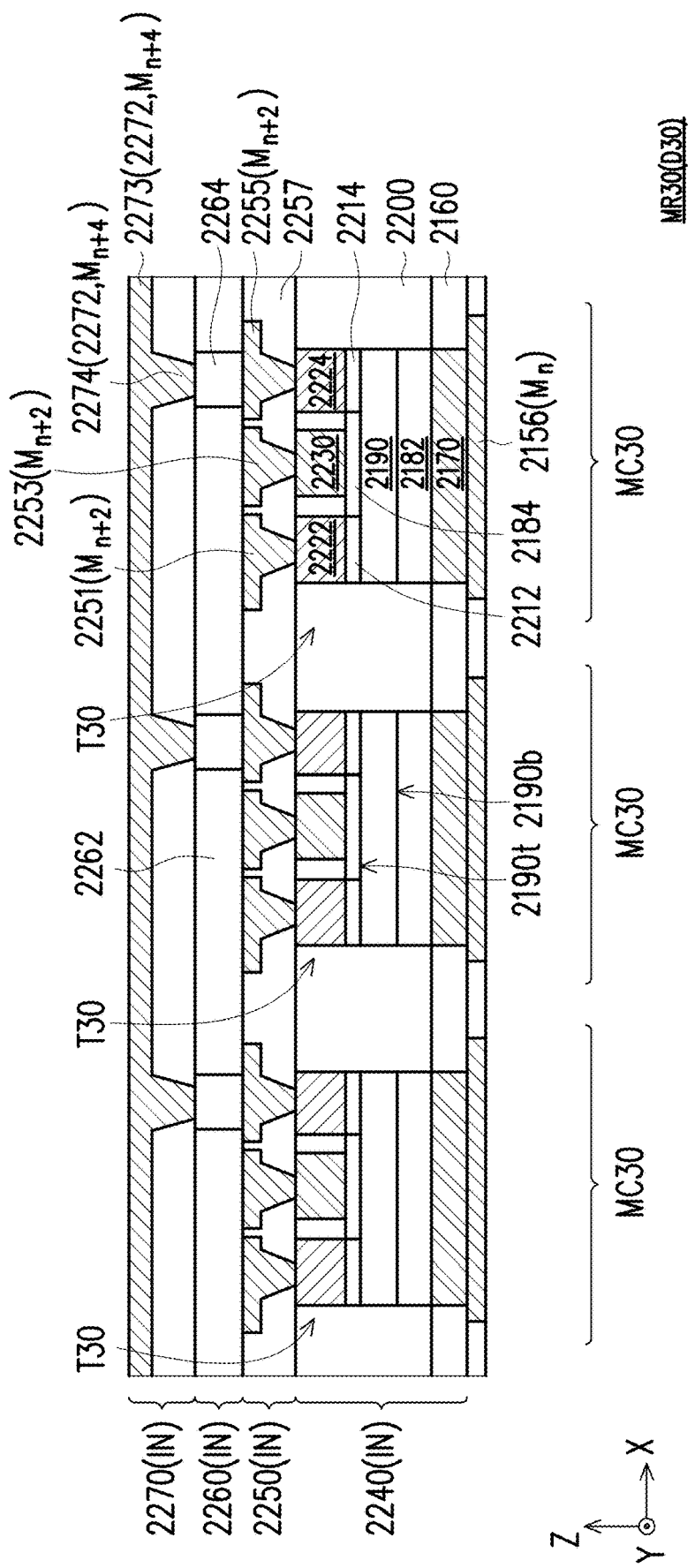
FIG. 3 is a schematic cross-sectional view of a semiconductor device according to some embodiments of the disclosure.

FIG. 3 is a schematic cross-sectional view of a portion of a semiconductor device D30 according to some embodiments of the disclosure. The semiconductor device D30 may be similar to the semiconductor devices D10 of FIG. 1M or D20 of FIG. 2F, and it is understood that similar material and processes as described above may be used for fabricating corresponding elements of the devices. The semiconductor device D30 includes the transistors T30 formed in the interconnection region IN. In some embodiments, the transistors T30 may be integrated in memory cells MC30, and an array of memory cells MC30 may be formed within a memory region MR30 of the interconnection region IN. Each memory cell MC30 includes a transistor T30 and an associated magnetic tunnel junction 2264, with the transistor T30 configured to act as selector for the associated magnetic tunnel junction 2264. In some embodiments, the transistors T30 are formed on the conductive patterns 2156 of the metallization level $M_n$ of the interconnection region IN, in the active device tier 2240. In some embodiments, the transistors T30 are double-gated transistors, including a channel strip 2190 sandwiched in between a pair of high-k dielectric strips 2182, 2184 and a pair of gate patterns 2170, 2230. More specifically, the gate pattern 2170, the high-k dielectric strip 2182, the channel strip 2190, the high-k dielectric strip 2184 and the gate pattern 2230 may be sequentially stacked on the conductive patterns 2156. The gate pattern 2170 may be entrenched in the interlayer dielectric 2160 formed on the conductive patterns 2156, and the remaining components may be embedded in the overlying interlayer dielectric 2200. The high-k dielectric strip 2182 may contact the channel strip 2190 at the bottom surface 2190b, while the high-k dielectric strip 2184 may contact the channel strip 2190 at the opposite top surface 2190t. In some embodiments, the high-k dielectric strip 2182 may have a different extension along the X direction than the high-k dielectric strip 2184. The width along the X direction of the high-k dielectric strip 2182 may be at least sufficient to separate the gate pattern 2170 from the channel strip 2190. Similarly, the width along the X direction of the high-k dielectric strip 2184 may be at least sufficient to separate the gate pattern 2230 from the channel strip 2190. In some embodiments, the width along the X direction of the gate pattern 2230 may be smaller than the width along the X direction of the gate pattern 2170. In some embodiments, the transistors T30 further include source and drain contacts 2222, 2224 contacting the top surfaces 2190t of the channel strips 2190 at opposite sides of the gate patterns 2230. Self-assembled monolayers 2212, 2214 are formed in between the source and drain contacts 2222, 2224 and the channel strips 2190, at the sides of the high-k dielectric strips 2184 and the gate pattern 2230.

In some embodiments, the source and drain contacts 2222, 2224, the gate pattern 2230, or both may be formed together with additional interconnection conductive patterns of the metallization level $M_{n+1}$ outside the memory region MR30. The drain contact 2224 may be connected to the magnetic tunnel junction 2264 formed in the magnetic junction tier 2260 by conductive patterns 2255, which may be part of a connection tier 2250 at a metallization level $M_{n+2}$. In some embodiments, the connection tier 2250 may further include conductive patterns 2251 contacting the source contact 2222 and conductive patterns 2253 contacting the gate patterns 2230. The interlayer dielectric 2257 may separate the conductive patterns 2251, 2253, 2255 of the connection tier 2250, and the magnetic tunnel junctions 2264 may be embedded in the interlayer dielectric 2262. In some embodiments, the memory cells MC30 may be part of a high-density memory (e.g., an MRAM, etc.), with the gate patterns 2170, 2230 configured as word lines and the conductive strips 2273 of the conductive patterns 2272 of a higher interconnection tier 2270 configured as the bit lines. Conductive vias 2274 may connect the conductive strips 2273 to the magnetic tunnel junctions 2264. Both the transistors T30 and the magnetic tunnel junctions 2264 are formed on top of the metallization level $M_n$ of the interconnection region IN.

In some embodiments, the manufacturing of the semiconductor device D30 may follow substantially the manufacturing process described above for the semiconductor device D20 with reference to FIG. 2A to FIG. 2F, with the addition of the formation of the high-k dielectric strips 2184 and the gate patterns 2230 disposed on the top surfaces 2190t of the channel strips 2190, similarly to what was previously described with reference from FIG. 1C to FIG. 1J.

FIG. 4A to FIG. 4D are schematic cross-sectional views of structures produced during a manufacturing method of a semiconductor device D40 according to some embodiments of the disclosure. The semiconductor device D40 may be similar to the semiconductor devices D10 of FIG. 1M, D20 of FIG. 2F, or D30 of FIG. 3, and it is understood that similar material and processes as described above may be used for fabricating corresponding elements of the devices. In some embodiments, the conductive patterns 3156 of the metallization level $M_n$ of the interconnection region IN include conductive strips extending parallel to each other along the X direction and separated along the Y direction by portions of interlayer dielectric. In some embodiments, an interlayer dielectric 3160 is formed on the conductive patterns 3156. The interlayer dielectric 3160 may include openings 3162. In some embodiments, there are as many openings 3162 as the number of transistors that are to be formed. In some embodiments, the openings 3162 may be formed in an array configuration, for example along the rows and columns of a matrix. In some embodiments, multiple portions of a given conductive strip of the conductive patterns 3156 may be exposed by some of the openings 3162. That is, different sections of a same conductive pattern 3156 may be exposed by different openings 3162. In some embodiments, a metallic material is disposed in the openings 3162 to form the conductive pads 3164. In some embodiments, the metallic material of the conductive pads 3164 may include aluminum, titanium, copper, nickel, tungsten, and/or alloys thereof, and may be fabricated through a sequence of deposition (e.g., CVD, plating, or other suitable processes) and planarization steps (e.g., chemical mechanical polishing).

An interlayer dielectric 3172 is then formed on the interlayer dielectric 3160. The interlayer dielectric 3172 includes openings 3174 exposing the conductive pads 3164, and openings 3176 exposing the interlayer dielectric 3160. In some embodiments, the openings 3174, 3176 are formed in pairs, with one opening 3174 having an associated opening 3176 disposed nearby, but the disclosure is not limited thereto. In some alternative embodiments, there may be more or fewer openings 3174 with respect to the openings 3176, depending on the circuit requirements. In some embodiments, a metallic material is disposed in the openings 3174, 3176 to form source and drain contacts 3175, 3177. In some embodiments, the source contacts 3175 may be formed in the openings 3174, and be connected to the conductive patterns 3156 by the conductive pads 3164, while the drain contacts 3177 may be formed in the openings 3176 and be separated from the conductive patterns 3156 by the interlayer dielectric 3160.

Figure 4C:
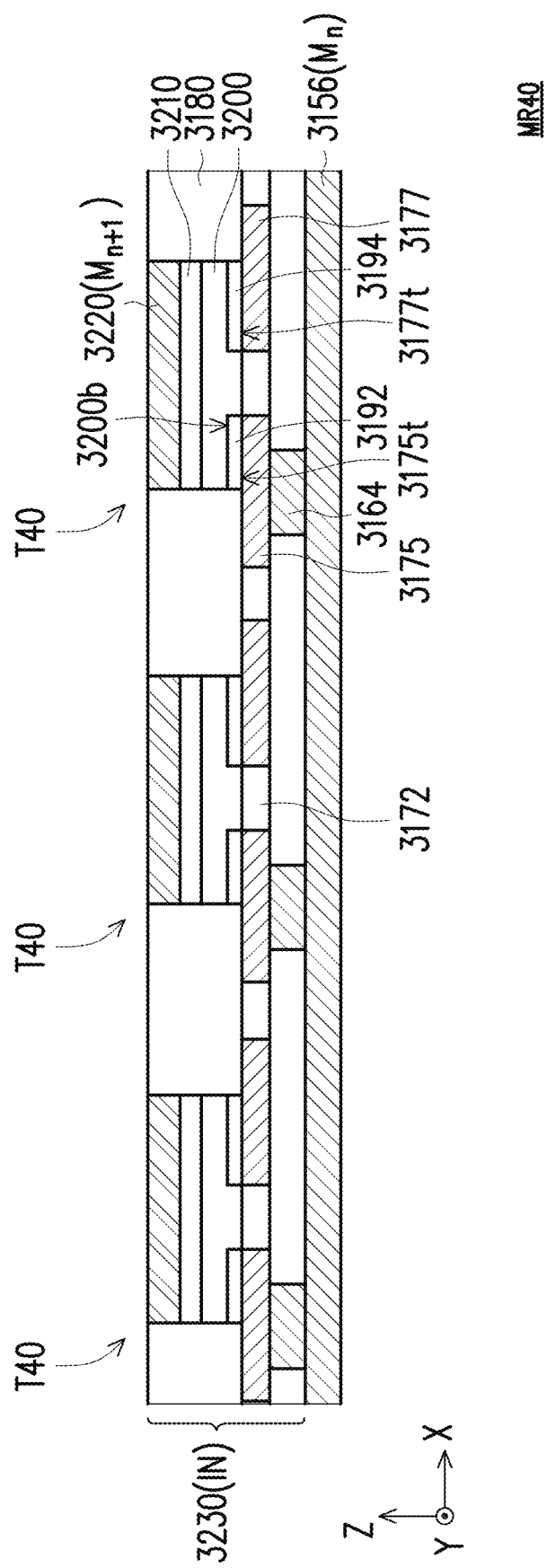

Referring to FIG. 4B, an interlayer dielectric 3180 is formed on the interlayer dielectric 3172. The interlayer dielectric 3180 may be patterned to include openings 3182. At the bottom of one opening 3182 may be exposed at least a portion of one source contact 3175 and a portion of a drain contact 3177. In some embodiments, each opening 3182 exposes a portion of a source contact 3175 and a drain contact 3177 of an associated pair of source and drain contacts 3175, 3177, with different pairs of source and drain contacts 3175, 3177 being exposed by different openings 3182. Referring to FIG. 4B and FIG. 4C, transistors T40 may be formed by disposing the required materials within the openings 3182. In some embodiments, self-assembled monolayers 3192, 3194 may be formed first on the exposed portions of source contacts 3175 and drain contacts 3177, respectively. In some embodiments, the organic material of the self-assembled monolayers 3192, 3194 may selectively bind to the metallic materials of the source and drain contacts 3175, 3177 in correspondence of the top surfaces 3175t, 3177t, so that no self-assembled monolayer is formed on the portion of interlayer dielectric 3172 separating the source contact 3175 from the drain contact 3177. The interlayer dielectric 3172 in between associated source contacts 3175 and drain contacts 3177 is also exposed in the opening 3182 during formation of the self-assembled monolayers 3175, 3177, however, the organic material of the self-assembled monolayer 3192, 3194 may not bind to the interlayer dielectric 3172. Thereafter, the channel strip 3200 is formed at the bottom of the openings 3182, on the self-assembled monolayers 3192, 3194 and the interlayer dielectric 3172. The self-assembled monolayers 3192, 3194 may be interposed between the source and drain contacts 3175, 3177 and the channel strip 3200, in contact with the bottom surface 3200b of the channel strip 3200, thus lowering the contact resistance of the transistors T40. High-k dielectric strip 3210 and gate patterns 3220 may be sequentially formed on the channel strip 3200. In some embodiments, the gate patterns 3220 are formed together with interconnection conductive patterns of the metallization level $M_{n+1}$ outside the memory region MR40, however, the disclosure is not limited thereto. In some embodiments, the interconnection tier 3230 in which the transistors T40 are formed is referred to as an active device tier.

Figure 4D:
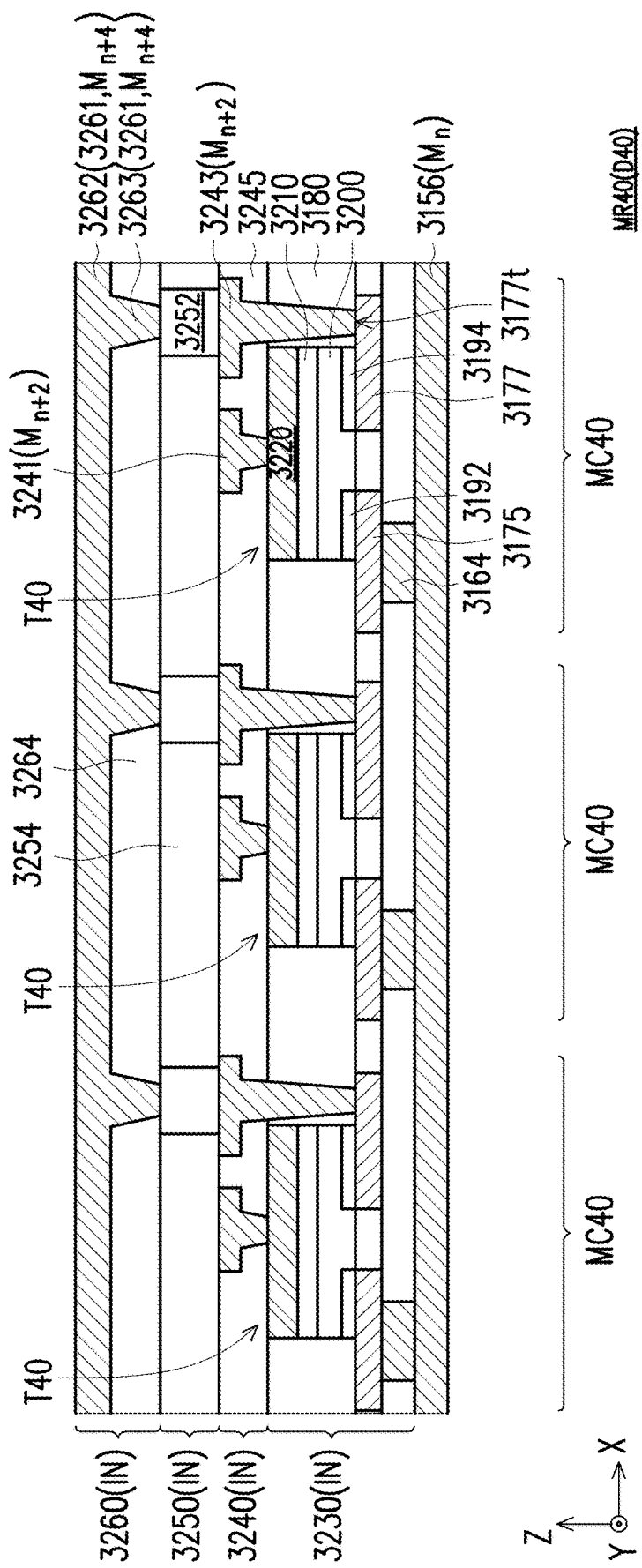

FIG. 4D is a schematic cross-sectional view of a portion the semiconductor device D40 according to some embodiments of the disclosure. In some embodiments, the semiconductor device D40 may be obtained from the structure illustrated in FIG. 4C following process steps similar to the ones described above with reference to FIG. 1K and FIG. 1L. Briefly, one or more connection tiers 3240 are formed on the active device tier 3230. While one connection tier 3240 is illustrated, multiple connection tiers may also be formed, according to routing requirements. The connection tier 3240 includes conductive patterns 3241, 3243 of a metallization level $M_{n+2}$ embedded in the interlayer dielectric 3245. The conductive patterns 3241 are connected to the gate patterns 3220. The conductive patterns 3243 may extend through the interlayer dielectrics 3245 and 3180 to establish electrical connection with the drain contacts 3177. In some embodiments, the portion of the conductive patterns 3243 extending through the interlayer dielectric 3180 may be formed before the interlayer dielectric 3245, so that the conductive patterns 3243 are formed during multiple deposition steps. In some alternative embodiments, the conductive patterns 3243 may be formed in a single deposition step, after patterning together the interlayer dielectrics 3245, 3180 to form openings exposing portions of the drain contacts 3177. In some embodiments, the conductive patterns 3243 land on portions of the top surface 3177t of the drain contacts free from the self-assembled monolayer 3194. A magnetic junction tier 3250 may then be formed on the connection tier(s) 3240. The magnetic junction tier 3250 includes magnetic tunnel junctions 3252 disposed on the conductive patterns 3243. The magnetic junction tier 3250 further includes an interlayer dielectric 3254 in which the magnetic tunnel junctions 3252 are embedded. In some embodiments, the magnetic junction tier 3250 further includes interconnection conductive patterns outside of the memory region MR40 which may be connected to conductive patterns of other tiers of the interconnection region IN to perform different logic functions. Upper interconnection tiers are formed on the magnetic junction tier 3250, one of which (e.g., the tier 3260) includes conductive strips 3262 extending in a perpendicular direction with respect to the gate patterns 3220, and connected to the magnetic tunnel junctions 3252 by conductive vias 3263. In some embodiments, the conductive strips 3262 and the conductive vias 3263 (sometimes collectively referred to as conductive patterns 3261) are part of the metallization level $M_{n+4}$.

The semiconductor device D40 includes at least one transistor T40 formed on the conductive patterns 3156 of a metallization level $M_n$ of the interconnection region IN (a back-end-of-line transistor). The transistor T40 includes at least a pair of source and drain contacts 3175, 3177 disposed at opposite sides of the gate pattern 3220, on an opposite side of the gate pattern 3220 with respect to the channel strip 3200. That is, the transistor T40 may be a top gate transistor with a staggered configuration of the source and drain contacts 3175, 3177 and the gate pattern 3220. Self-assembled monolayers 3192, 3194 are formed on the source and drain contacts 3175, 3177, and are disposed between the channel strip 3200 and the source and drain contacts 3175, 3177.

In some embodiments, the transistor T40 may be integrated within larger circuits. For example, the semiconductor device D40 may include the memory region MR40 located within the interconnection region IN. In the memory region MR40, an array of memory cells MC40 is formed. Each memory cell MC40 includes a transistor T40 and a magnetic tunnel junction 3252. That is, the semiconductor device D40 may be or include a high-density non-volatile memory such as an MRAM, an RRAM, a PCRAM, a CBRAM, or the like. The drain contact 3177 of the transistor T40 and the magnetic tunnel junction 3252 may be connected by the conductive patterns (e.g., the conductive patterns 3243) of one or more connection tiers 3240 of the interconnection region IN.

Figure 5C:
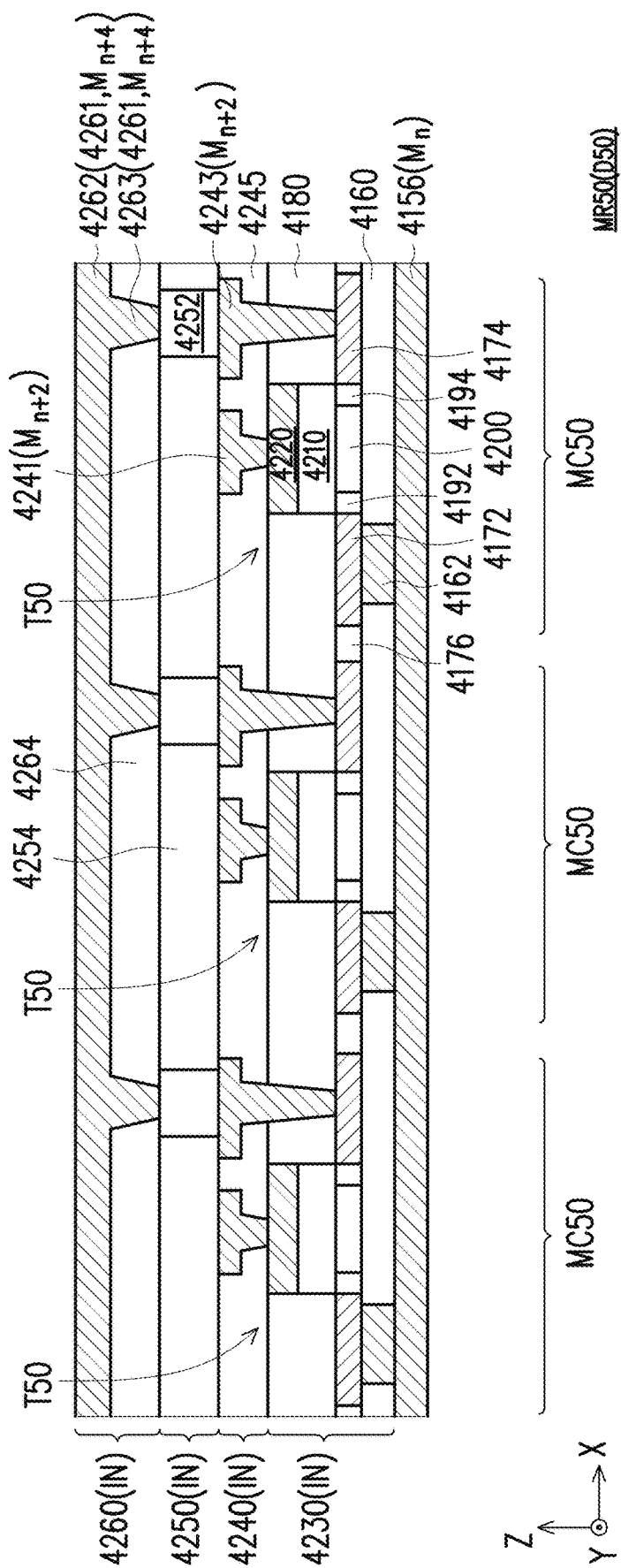

FIG. 5A to FIG. 5C are schematic cross-sectional views of structures produced during a manufacturing method of a semiconductor device D50 according to some embodiments of the disclosure. The semiconductor device D50 may be similar to the semiconductor devices D10 of FIG. 1M, D20 of FIG. 2F, D30 of FIG. 3, or D40 of FIG. 4D, and it is understood that similar material and processes as described above may be used for fabricating corresponding elements of the devices. In some embodiments, the structure of FIG. 5A may be obtained in a similar fashion as previously described with reference to FIG. 4A and FIG. 4B. Briefly, contact pads 4162 embedded in an interlayer dielectric 4160 are formed on the conductive patterns 4156 of the metallization level $M_n$. Source and drain contacts 4172, 4174 are then formed on the interlayer dielectric 4160 and the contact pads 4162, embedded within the interlayer dielectric 4176. The source contacts 4172 are connected by the contact pads 4162 to the conductive patterns 4156, while the interlayer dielectric 4160 separates the drain contacts 4174 from the conductive patterns 4156. The interlayer dielectric 4180 including openings 4182 is then formed on the source and drain contacts 4172, 4174 and the interlayer dielectric 4176. At the bottom of one opening 4182 may be exposed at least a portion of one source contact 4172 and a portion of a drain contact 4174. In some embodiments, each opening 4182 exposes a portion of a source contact 4172 and a drain contact 4174 of an associated pair of source and drain contacts 4172, 4174, with different pairs of source and drain contacts 4172, 4174 being exposed by different openings 4182. In some embodiments, the openings 4182 extend in between the source and drain contacts 4172, 4174, revealing facing side surfaces 4172s, 4174s of the source and drain contacts 4172, 4174. In some embodiments, even after formation of the openings 4182 the top surfaces 4172t, 4174t of the source and drain contacts may be covered by the interlayer dielectric 4180, while the side surfaces 4172s, 4174s may be exposed at the sidewalls of the openings 4182. However, the disclosure is not limited thereto, and, in some alternative embodiments, portions of the top surfaces 4172t 4174t may be exposed by the openings 4182.

Referring to FIG. 5A and FIG. 5B, the openings 4182 may be filled so as to form the transistors T50. First, self-assembled monolayers 4192, 4194 are formed on the side surfaces 4172t, 4174t of the source and drain contacts 4172, 4174 exposed at the bottom of the openings 4182. In some embodiments, when portions of the top surfaces 4172t, 4174t are also exposed at the bottom of the openings 4182, the self-assembled monolayers 4192, 4194 may further extends on the exposed portions of the top surfaces 4172t, 4174t. Then, the material of the channel strip 4200 may be disposed on the interlayer dielectric 4160 at the bottom of the openings 4182, in between source and drain contacts 4172, 4174 exposed by a same opening 4182. Optionally, the channel strip 4200 may extend over the source and drain contacts 4172, 4174, if originally exposed by the openings 4182. The self-assembled monolayers 4192, 4194 extend in between the source and drain contacts 4172, 4174 and the channel strip 4200, thus lowering the contact resistance of the transistors T50. High-k dielectric strips 4210 and gate patterns 4220 may be sequentially formed on the channel strip 4200. In some embodiments, the gate patterns 4220 are formed together with interconnection conductive patterns of the metallization level $M_{n+1}$ outside the memory region MR50, however, the disclosure is not limited thereto. In some embodiments, the interconnection tier 4230 in which the transistors T50 are formed is referred to as an active device tier.

FIG. 5C is a schematic cross-sectional view of a portion the semiconductor device D50 according to some embodiments of the disclosure. In some embodiments, the semiconductor device D50 may be obtained from the structure illustrated in FIG. 5B following process steps similar to the ones described above with reference to FIG. 1K and FIG. 1L. Briefly, one or more connection tiers 4240 are formed on the active device tier 4230. While one connection tier 4240 is illustrated, multiple connection tiers may also be formed, according to routing requirements. The connection tier 4240 includes conductive patterns 4241, 4243 of a metallization level $M_{n+2}$ embedded in the interlayer dielectric 4245. The conductive patterns 4241 are connected to the gate patterns 4220. The conductive patterns 4243 may extend through the interlayer dielectrics 4245 and 4180 to establish electrical connection with the drain contacts 4174. A magnetic junction tier 4250 may then be formed on the connection tier(s) 4240. The magnetic junction tier 4250 includes magnetic tunnel junctions 4252 disposed on the conductive patterns 4243. The magnetic junction tier 4250 further includes an interlayer dielectric 4254 in which the magnetic tunnel junctions 4252 are embedded. In some embodiments, the magnetic junction tier 4250 further includes interconnection conductive patterns outside of the memory region MR50 which may be connected to conductive patterns of other tiers of the interconnection region IN to perform different logic functions. Upper interconnection tiers are formed on the magnetic junction tier 4250, one of which (e.g., the tier 4260) includes conductive strips 4262 extending in a perpendicular direction with respect to the gate patterns 4220, and connected to the magnetic tunnel junctions 4252 by conductive vias 4263 extending through the interlayer dielectric 4264. In some embodiments, the conductive strips 4262 and the conductive vias 4263 (sometimes referred to as conductive patterns 4261) are part of the metallization level $M_{n+4}$.

The semiconductor device D50 includes at least one transistor T50 formed on the conductive patterns 4156 of a metallization level $M_n$ of the interconnection region IN (a back-end-of-line transistor). The transistor T50 includes at least a pair of source and drain contacts 4172, 4174 disposed at opposite sides of the gate pattern 4220, on an opposite side of the gate pattern 4220 with respect to the channel strip 4200. That is, the transistor T50 may be a top gate transistor with a staggered configuration of the source and drain contacts 4172, 4174 and the gate pattern 4220. Self-assembled monolayers 4192, 4194 are formed on the source and drain contacts 4172, 4174, and are disposed between the channel strip 4200 and the source and drain contacts 4172, 4174.

In some embodiments, the transistor T50 may be integrated within larger circuits. For example, the semiconductor device D50 may include the memory region MR50 located within the interconnection region IN. In the memory region MR50, an array of memory cells MC50 is formed. Each memory cell MC50 includes a transistor T50 and a magnetic tunnel junction 4252. That is, the semiconductor device D50 may be or include a high-density non-volatile memory such as an MRAM, an RRAM, a PCRAM, a CBRAM, or the like. The drain contact 4174 of the transistor T50 and the magnetic tunnel junction 4252 may be connected by the conductive patterns (e.g., the conductive patterns 4243) of one or more connection tiers 4240 of the interconnection region IN.

Figure 6C:
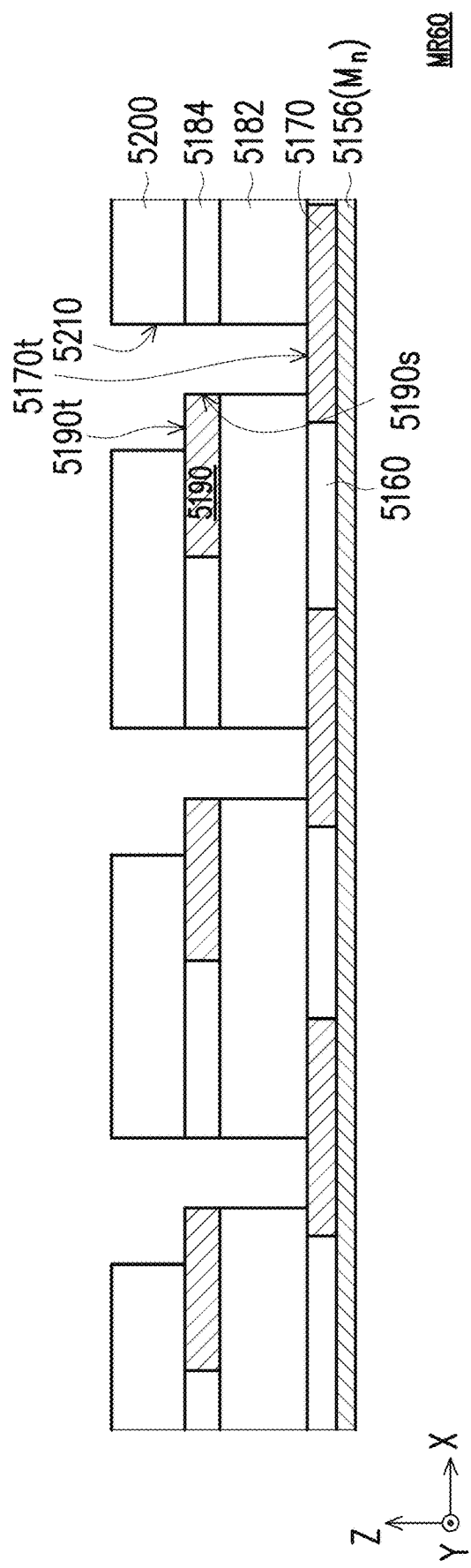

FIG. 6A to FIG. 6E are schematic cross-sectional views of structures produced during a manufacturing method of a semiconductor device D60 according to some embodiments of the disclosure. The semiconductor device D60 may be similar to the semiconductor devices D10 of FIG. 1M, D20 of FIG. 2F, D30 of FIG. 3, D40 of FIG. 4D, or D50 of FIG. 5C and it is understood that similar material and processes as described above may be used for fabricating corresponding elements of the devices. Referring to FIG. 6A, an interlayer dielectric 5160 is formed on the conductive patterns 5156 of the metallization level $M_n$. In some embodiments, the conductive patterns 5156 include conductive strips extending parallel to each other along the X direction and separated along the Y direction by portions of an interlayer dielectric underlying the interlayer dielectric 5160. The interlayer dielectric 5160 includes openings 5162 exposing portions of the conductive patterns 5156. In some embodiments, there are as many openings 5162 as the number of transistors that are to be formed. In some alternative embodiments, the number of openings 5162 may be greater than or smaller than the number of transistors that are to be formed. In some embodiments, the openings 5162 may be formed in an array configuration, for example along the rows and columns of a matrix. In some embodiments, multiple portions of a given conductive strip of the conductive patterns 5156 may be exposed by some of the openings 5162. That is, different sections of a same conductive pattern 5156 may be exposed by different openings 5162. In some embodiments, a metallic material is disposed in the openings 5162 to form the source contacts 5170.

Referring to FIG. 6B, an interlayer dielectric 5182 is formed on the interlayer dielectric 5160 and the source contacts 5170. In some embodiments, the source contacts 5170 may be completely covered by the interlayer dielectric 5182. Another interlayer dielectric 5184 may be formed on the interlayer dielectric 5182. In some embodiments, the interlayer dielectric 5184 may include openings 5186 exposing portions of the interlayer dielectric 5182. In some embodiments, the interlayer dielectrics 5182, 5184 include different materials, and the openings 5186 may be formed by selectively removing portions of the interlayer dielectric 5184 during an etching step. In some alternative embodiments, an etch stop layer (not shown) may be provided on the interlayer dielectric 5182, before forming the interlayer dielectric 5184. In some yet alternative embodiments, the depth of the openings 5186 may be determined by controlling the reaction time during the etching step, and may result in openings 5186 partially extending within the interlayer dielectric 5184 and the interlayer dielectric 5182. In some yet alternative embodiments, formation of the interlayer dielectric 5184 may be skipped, and the openings 5186 may be formed in the interlayer dielectric 5182. A metallic material may be filled in the openings 5186 to form the drain contacts 5190. In some embodiments, the interlayer dielectric 5182 vertically separates the drain contacts 5190 from the interlayer dielectric 5160 and the source contacts 5170. In some embodiments, the span of the drain contacts 5190 in the XY plane may partially overlap with the span of the source contacts 5170. That is, a portion of a drain contact 5190 may overlay a portion of a source contact 5170.

Referring to FIG. 6C, in some embodiments, an interlayer dielectric 5200 is formed on the interlayer dielectric 5184 and the drain contacts 5190. The interlayer dielectric 5200 may initially cover the drain contacts 5190 as well as the interlayer dielectric 5184. In some embodiments, openings 5210 are formed extending through the interlayer dielectrics 5200, 5184, 5182 to expose portions of the source and drain contacts 5170, 5190. In some embodiments, the openings 5210 may be L-shaped, with an arm extending vertically (along the Z direction) through the interlayer dielectrics 5200, 5184, 5182 to expose the source contact 5170, and an arm extending horizontally (in the XY plane) in the interlayer dielectric 5200. The drain contact 5190 may be exposed at the joint of the two arms, so that both a portion of the top surface 5190$t$ and a side surface 5190$s$ of the drain contact 5190 are exposed by the opening 5210. For the source contact 5190, only a portion of the top surface 5190*t* may be exposed at the bottom of the opening 5210.

Figure 6D:
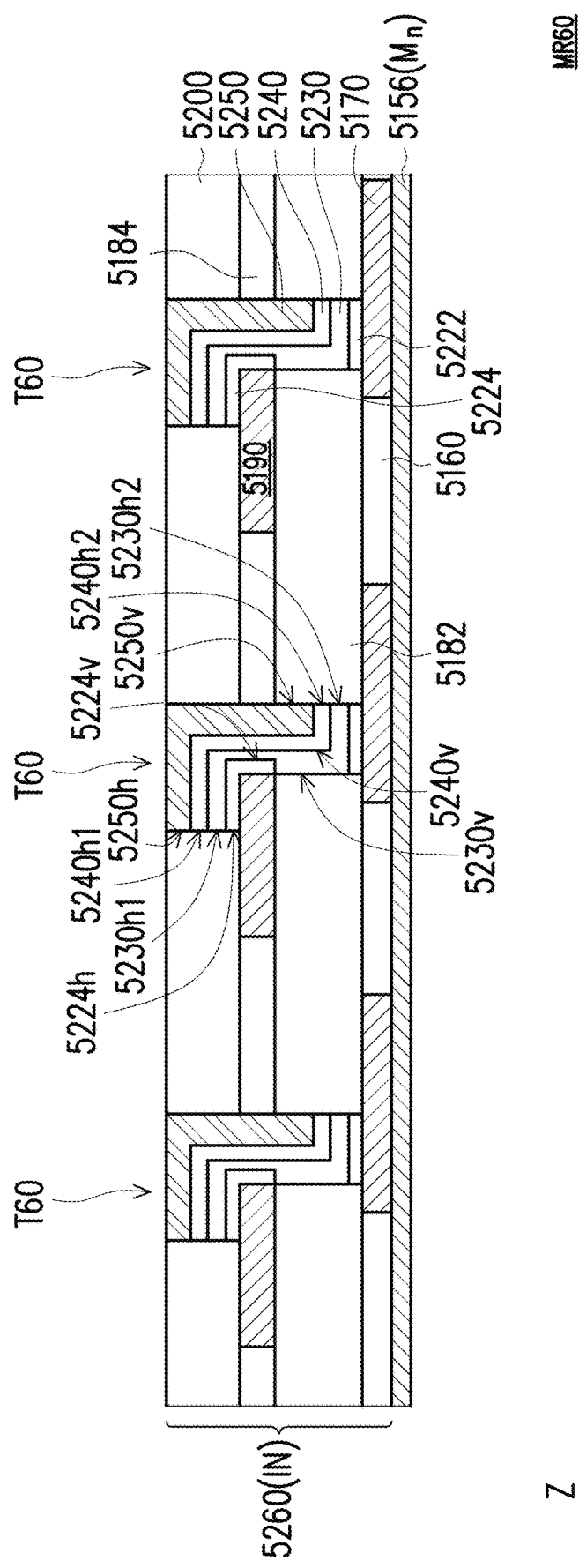

Referring to FIG. 6C and FIG. 6D, the self-assembled monolayers 5222, 5224, the channel strip 5230, the high-k dielectric strip 5240, and the gate patterns 5250 may be formed, in this order, within the openings 5210 to form the transistors T60. In some embodiments, the self-assembled monolayer 5222 is formed on the exposed portion of the top surface 5170*t* of the source contact 5170, and extends substantially horizontally (in the XY plane) at the bottom of the opening 5210. The self-assembled monolayer 5224 may be formed on the portion of the top surface 5190*t* and the side surface 5190*s* of the drain contact 5190 exposed by the opening 5210. In some embodiments, a section 5224*h* of the self-assembled monolayer 5224 extends horizontally on the top surface 5190*t* of the source contact 5190, and a contiguous section 5224*v* of the self-assembled monolayer 5224 extends vertically (along the Z direction, in a ZY plane) on the side surface 5190*s* of the drain contact 5190. That is, the self-assembled monolayer 5224 may also be L-shaped. The channel strips 5230 include at least three sections, two sections 5230*h*1, 5230*h*2 extending horizontally in XY planes located at different level heights along the Z direction, and a section 5230*v* extending vertically in a ZY plane to join the two horizontal sections. The section 5230*h*1 extends on the horizontal section 5224*h* of the self-assembled monolayer 5224, and the section 5230*h*2 extends on the self-assembled monolayer 5222. The vertical section 5230*v* extends on the vertical section 5224*v* of the self-assembled monolayer 5224, and further on the interlayer dielectric 5182 to reach the horizontal section 5230*h*2. That is, in some embodiments, the channel strip 5230 may have an overall step-like shape. Similarly, the high-k dielectric strip 5240 may have a step-like shape, with two horizontal sections 5240*h*1, 5240*h*2 extending at different level heights along the Z direction being joined to each other by a vertical section 5240*v*. Finally, the gate pattern 5250 may fill the rest of the openings 5210, and have an L-shape with a horizontal section 5250*h* and a vertical section 5250*v*. During operation of the transistors T60, electrical current may flow from the source contacts 5170 to the drain contacts 5190 through the channel strip 5230 along the vertical Z direction. That is, the transistors T60 formed in the active device tier 5260 may have a vertical channel configuration.

Figure 6E:
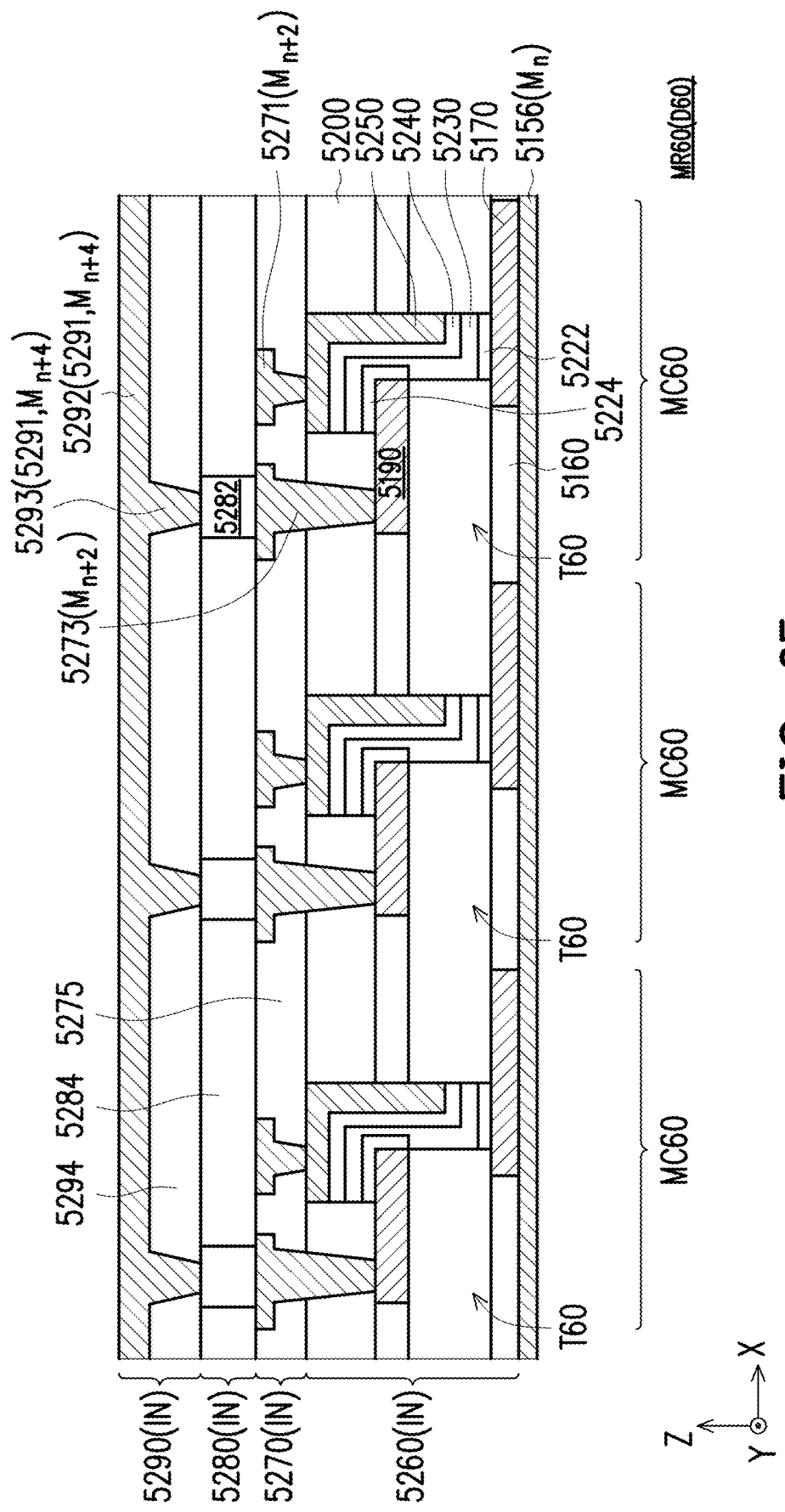

FIG. 6E is a schematic cross-sectional view of a portion the semiconductor device D60 according to some embodiments of the disclosure. In some embodiments, the semiconductor device D60 may be obtained from the structure illustrated in FIG. 6D following process steps similar to the ones described above with reference to FIG. 1K and FIG. 1L. Briefly, one or more connection tiers 5270 are formed on the active device tier 5260. While one connection tier 5270 is illustrated, multiple connection tiers may also be formed, according to routing requirements. The connection tier 5270 includes conductive patterns 5271, 5273 of a metallization level $M_{n+2}$ embedded in the interlayer dielectric 5275. The conductive patterns 5271 are connected to the gate patterns 5250. The conductive patterns 5273 may extend through the interlayer dielectrics 5275 and 5200 to establish electrical connection with the drain contacts 5190. A magnetic junction tier 5280 may then be formed on the connection tier(s) 5270. The magnetic junction tier 5280 includes magnetic tunnel junctions 5282 disposed on the conductive patterns 5273. The magnetic junction tier 5282 further includes an interlayer dielectric 5284 in which the magnetic tunnel junctions 5282 are embedded. In some embodiments, the magnetic junction tier 5280 further includes interconnection conductive patterns outside of the memory region MR60 which may be connected to conductive patterns of other tiers of the interconnection region IN to perform different logic functions. Upper interconnection tiers are formed on the magnetic junction tier 5280, one of which (e.g., the tier 5290) includes conductive strips 5292 extending in a perpendicular direction with respect to the gate patterns 5250, and connected to the magnetic tunnel junctions 5282 by conductive vias 5293 extending through the interlayer dielectric 5294. In some embodiments, the conductive strips 5292 and the conductive vias 5293 (sometimes collectively referred to as conductive patterns 5291) are part of the metallization level $M_{n+4}$.

The semiconductor device D60 includes at least one transistor T60 formed on the conductive patterns 5156 of a metallization level $M_n$ of the interconnection region IN (a back-end-of-line transistor). The transistor T60 includes at least a pair of source and drain contacts 5170, 5190 contacting different ends of the channel strip 5230 and located at different level heights along the Z direction with respect to each other. The channel strip 5230 may extend vertically from the source contact 5170 to the drain contact 5190. That is, the transistor T60 may be a vertical channel transistor. Self-assembled monolayers 5222, 5224 are formed on the source and drain contacts 5170, 5190, and are disposed between the channel strip 5230 and the source and drain contacts 5170, 5190, thus lowering the contact resistance of the transistor T60.

In some embodiments, the transistor T60 may be integrated within larger circuits. For example, the semiconductor device D60 may include the memory region MR60 located within the interconnection region IN. In the memory region MR60, an array of memory cells MC60 is formed. Each memory cell MC60 includes a transistor T60 and a magnetic tunnel junction 5282. That is, the semiconductor device D60 may be or include a high-density non-volatile memory such as an MRAM, an RRAM, a PCRAM, a CBRAM, or the like. The drain contact 5190 of the transistor T60 and the magnetic tunnel junction 5282 may be connected by the conductive patterns (e.g., the conductive patterns 5273) of one or more connection tiers 5270 of the interconnection region IN.

Based on the above, a semiconductor device according to some embodiments of the disclosure may include a back-end-of-line transistor having self-assembled monolayers formed in between source and drain contacts and a strip of channel material. The channel material may be a semiconductor material such as a semiconductor oxide, for example a ternary or higher semiconductor oxide. In some embodiments, the self-assembled monolayers are monolayers formed on the channel material or on the metallic material of the source and drain contacts. In some embodiments, the self-assembled monolayers include compounds having a polar group which can interact with the materials of the channel strip or the source and drain contacts. In some embodiments, the polar group may bind to the material of the channel strip and the source and drain contacts. In some embodiments, the self-assembled monolayers may lower the contact resistance between the source and drain contacts and the channel strip. By doing so, the current flowing through the transistor may increase. When the transistor is integrated within larger circuits, the response time of the circuits may be consequently shortened.

It will be apparent that while some transistor geometries were illustrated above, the disclosure is not limited thereto. For examples, the self-assembled monolayers may be applied to lower the contact resistance for back-end-of-line planar transistors, FinFET transistors, gate-all-around transistors, and any other gate geometry with may be realized for back-end-of-line transistors. Furthermore, while the embodiments described above illustrated the back-end-of-line transistors used as selectors in non-volatile memory circuits, the disclosure is not limited thereto. In some alternative embodiments of the disclosure, the back-end-of-line transistors including the self-assembled monolayers may be used to perform different logic functions, and may not be integrated in memory circuits.

In accordance with some embodiments of the disclosure, a back-end-of-line transistor includes a channel strip, a source contact, a drain contact, a high-k dielectric strip, a gate pattern, and self-assembled monolayers. The channel strip includes a semiconductor oxide material. The source contact contacts a first end of the channel strip. The drain contact contacts a second end of the channel strip. The high-k dielectric strip extends on the channel strip in between the first end and the second end of the channel strip. The gate pattern extends on the high-k dielectric strip. The self-assembled monolayers are disposed in between the channel strip and the source and drain contacts. The self-assembled monolayers include a compound having a polar group. The polar group is bonded to at least one selected from the channel strip, the source contact, and the drain contact.

In accordance with some embodiments of the disclosure, a semiconductor device includes a semiconductor substrate, lower interconnection tiers, and an active device tier. The lower interconnection tiers are disposed on the semiconductor substrate. The active device tier is disposed on the lower interconnection tiers. The active device tier includes a transistor. The transistor includes a channel strip of semiconductor material, a gate pattern, monolayers, a source contact and a drain contact. The gate pattern extends over a first surface of the channel strip. The monolayers are disposed on a second surface of the channel strip, and include a first compound. The source contact is separated from the channel strip by a first monolayer of the monolayers. The drain contact is separated from the channel strip by a second monolayer of the monolayers. The first compound is an organic compound including a polar group and a hydrophobic chain, wherein the polar group is bonded to the semiconductor material of the channel strip.

In accordance with some embodiments of the disclosure, a manufacturing method of a semiconductor device includes the following steps. A semiconductor oxide material is disposed over lower interconnection tiers to form a channel strip. The lower interconnection tiers are stacked over each other on a semiconductor substrate. A high-k dielectric material is disposed on the semiconductor oxide material to form a high-k dielectric strip. At least two ends of the channel strip are contacted with an organic material. The organic material includes a polar group which binds to the semiconductor oxide material. A first metallic material is disposed on the organic material on the at least two ends of the channel strip to form a pair of source and drain contacts. A second metallic material is disposed on the high-k dielectric strip to form a gate pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate pattern, elevated from a substrate;
   a gate dielectric strip, lying on the gate pattern;
   a channel strip, stacked on the gate dielectric strip, and formed of an oxide semiconductor material;
   a source contact and a drain contact, disposed over the channel strip, and overlapping opposite ends of the channel strip;
   a first self-assembled monolayer, interposed between the source contact and the channel strip; and
   a second self-assembled monolayer, interposed between the drain contact and the channel strip, and laterally spaced apart from the first self-assembled monolayer.

2. The semiconductor device according to claim 1, wherein the first self-assembled monolayer and the second self-assembled monolayer respectively comprise amphiphilic molecules, each having a polar group and a hydrophobic chain.

3. The semiconductor device according to claim 2, wherein the polar group bonds to surface atoms of the channel strip, while the hydrophobic chain projects away from the channel strip.

4. The semiconductor device according to claim 1, wherein the first self-assembled monolayer and the second self-assembled monolayer are selectively formed on the channel strip, without binding to a surrounding interlayer dielectric.

5. The semiconductor device according to claim 1, wherein an organic material forming the first self-assemble monolayer and the second self-assembled monolayer is selected from a group consisting of alkylamine, alkanethiol, alkyl-trialkoxysilane, aliphatic carboxylic acid and thioalkyl-carboxylic acid.

6. The semiconductor device according to claim 1, wherein an organic material forming the first self-assemble monolayer and the second self-assembled monolayer is alkylamine of formula $NR_2L$, where R is hydrogen or an alkyl group having 1 to 20 carbon atoms, and L is an alkyl group having 1 to 20 carbon atoms.

7. The semiconductor device according to claim 1, wherein an organic material forming the first self-assemble monolayer and the second self-assembled monolayer is primary aliphatic amine including hexylamine, heptylamine or octylamine.

8. The semiconductor device according to claim 1, wherein an organic material forming the first self-assemble monolayer and the second self-assembled monolayer is alkanethiol of formula $CH_3(CH_2)_nSH$, where n is in a range from 1 to 5.

9. The semiconductor device according to claim 1, wherein an organic material forming the first self-assemble monolayer and the second self-assembled monolayer is alkyl-trialkoxysilane of formula $SiR_3L$, where each R is independently an alkoxy group having a chain of 1 to 20 carbon atoms, and L is an alkylene chain having 1 to 20 carbon atoms.

10. The semiconductor device according to claim 1, wherein an organic material forming the first self-assemble monolayer and the second self-assembled monolayer is aliphatic carboxylic acid of formula $CH_3(CH_2)_nCOOH$, where n is in a range from 1 to 5.

11. The semiconductor device according to claim 1, wherein an organic material forming the first self-assemble monolayer and the second self-assembled monolayer is thioalkyl-carboxylic acid of formula $SH(CH_2)_nCOOH$, where n is in a range from 1 to 5.

12. The semiconductor device according to claim 1, further comprising:
an additional gate pattern, disposed over the channel strip and located between the source contact and the drain contact; and
an additional gate dielectric strip, lying between the channel strip and the additional gate pattern.

13. A semiconductor device, comprising:
active devices, built from a surface region of a substrate;
an interconnection tier, formed over the substrate, and comprising conductive features, wherein the active devices are routed via the conductive features; and
transistors, formed on top conductive features of the conductive features in the interconnection tier, and respectively comprising:
a gate pattern, formed on one of the top conductive features;
a gate dielectric strip, lying on the gate pattern;
a channel strip, stacked on the gate dielectric strip, and formed of an oxide semiconductor material;
a source contact and a drain contact, disposed over the channel strip, and overlapping opposite ends of the channel strip;
a first self-assembled monolayer, interposed between the source contact and the channel strip; and
a second self-assembled monolayer, interposed between the drain contact and the channel strip, and laterally spaced apart from the first self-assembled monolayer.

14. The semiconductor device according to claim 13, wherein the transistors are laterally separated via an interlayer dielectric filled in between.

15. The semiconductor device according to claim 14, wherein the interlayer dielectric is also formed on the channel strip of each transistor, and lateral separation of the source contact and the first self-assembled monolayer from the drain contact and the second self-assembled monolayer in each transistor is implemented by the interlayer dielectric.

16. The semiconductor device according to claim 15, wherein the first self-assembled monolayer and the second self-assembled monolayer are selectively formed on the channel strip in each transistor, without binding to the interlayer dielectric.

17. The semiconductor device according to claim 13, wherein each transistor further comprises:
an additional gate pattern, disposed over the channel strip and located between the source contact and the drain contact; and
an additional gate dielectric strip, lying between the channel strip and the additional gate pattern.

18. A semiconductor device, comprising:
memory cells, respectively having a transistor and a storage device coupled to the transistor, wherein the transistor in each memory cell comprises:
a gate pattern, elevated from a substrate;
a gate dielectric strip, lying on the gate pattern;
a channel strip, stacked on the gate dielectric strip, and formed of an oxide semiconductor material;
a source contact and a drain contact, disposed over the channel strip, and overlapping opposite ends of the channel strip;
a first self-assembled monolayer, interposed between the source contact and the channel strip; and
a second self-assembled monolayer, interposed between the drain contact and the channel strip, and laterally spaced apart from the first self-assembled monolayer.

19. The semiconductor device according to claim 18, wherein the storage device in each memory cell is a magnetic tunnel junction.

20. The semiconductor device according to claim 18, wherein each transistor further comprises:
an additional gate pattern, disposed over the channel strip and located between the source contact and the drain contact; and
an additional gate dielectric strip, lying between the channel strip and the additional gate pattern.

* * * * *